(12) United States Patent
Iqbal

(10) Patent No.: US 11,921,534 B2
(45) Date of Patent: Mar. 5, 2024

(54) STARTUP CIRCUIT AND METHODS THEREOF

(71) Applicant: Ferroelectric Memory GmbH, Dresden (DE)

(72) Inventor: Rashid Iqbal, Dresden (DE)

(73) Assignee: FERROELECTRIC MEMORY GMBH, Dresden (DE)

(*) Notice: Subject to any disclaimer, the term of this patent is extended or adjusted under 35 U.S.C. 154(b) by 211 days.

(21) Appl. No.: 17/400,427

(22) Filed: Aug. 12, 2021

(65) Prior Publication Data

US 2023/0046259 A1    Feb. 16, 2023

(51) Int. Cl.
G05F 3/08 (2006.01)
G05F 3/26 (2006.01)
G11C 5/14 (2006.01)

(52) U.S. Cl.
CPC .............. G05F 3/262 (2013.01); G11C 5/147 (2013.01)

(58) Field of Classification Search
CPC . G05F 3/08; G05F 3/222; G05F 3/225; G05F 3/227; G05F 3/242; G05F 3/26; G05F 3/262; G05F 3/265; G05F 3/267

USPC .......................................... 323/281; 327/539
See application file for complete search history.

(56) References Cited

U.S. PATENT DOCUMENTS 10,386,879 B2 *  8/2019  Yen ............................ G05F 3/08
10,401,887 B2 *  9/2019  Huang ...................... G05F 3/30

* cited by examiner

*Primary Examiner* — Hai L Nguyen
(74) *Attorney, Agent, or Firm* — Hickman Becker Bingham Ledesma LLP

(57) ABSTRACT

Various aspects relate to a startup circuit for a bandgap reference circuit, wherein a target voltage value is associated with the bandgap reference circuit, the target voltage value being indicative of a startup condition of the bandgap reference circuit that triggers a stable on-state of the bandgap reference circuit, wherein the startup circuit is configured to: provide a startup voltage at the bandgap reference circuit to trigger a start of an operation of the bandgap reference circuit; receive a feedback voltage, wherein the feedback voltage is representative of a startup condition of the bandgap reference circuit; and either increase the startup voltage at the bandgap reference circuit in the case that a voltage value of the feedback voltage is less than the target voltage value, or stop providing the startup voltage at the bandgap reference circuit in the case that the voltage value of the feedback voltage is equal to or greater than the target voltage value.

15 Claims, 9 Drawing Sheets

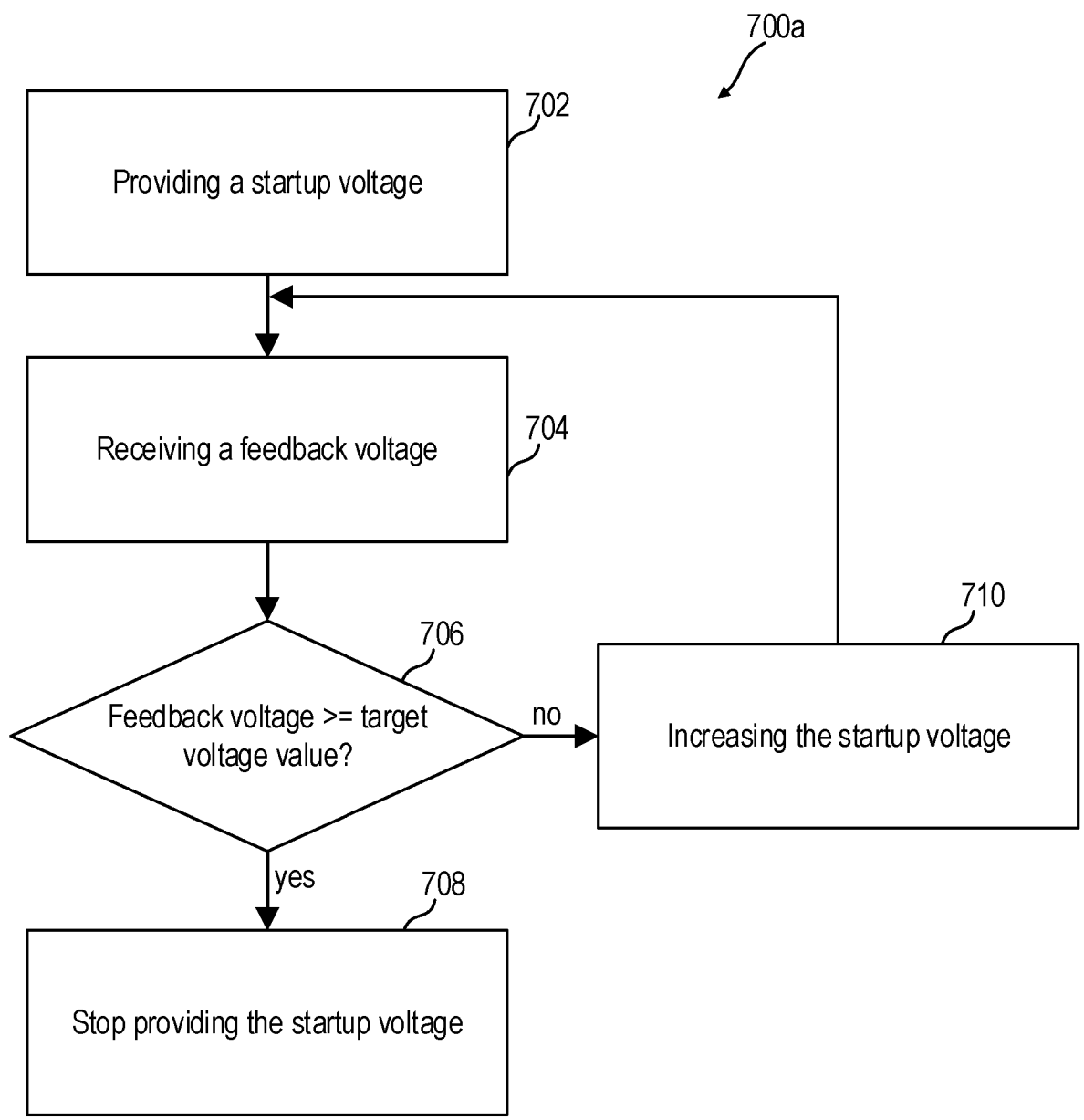

STARTUP CIRCUIT AND METHODS THEREOF

TECHNICAL FIELD

Various aspects relate to a startup circuit (e.g., a startup circuit for a bandgap reference circuit) and methods thereof, e.g., a method of operating a startup circuit.

BACKGROUND

In general, the generation of reference voltages having a stable and predefined value plays an important role for the operation of a variety of analog and digital circuits, such as analog-to-digital or digital-to-analog converters, voltage regulators, data acquisition circuits, or memory cell arrangements (e.g., flash memories or Dynamic Random Access Memories, DRAM, as examples). Various technologies have been developed for the generation of reference voltages, for example using Zener diodes, using the threshold voltage(s) of field-effect transistors, or using so-called bandgap reference (BGR) circuits. Among the possible alternatives, the bandgap reference approach provides a solution that may be readily integrated on a chip (e.g., with complementary metal-oxide-semiconductor, CMOS, processing) and that is capable of providing a stable and well-defined voltage value with low sensitivity to temperature variations. A bandgap reference circuit may operate in combination with a startup circuit, which is used to trigger the start of the operation of the bandgap reference circuit.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIG. 7A and FIG. 7B each shows a schematic flow diagram of a method of operating a startup circuit, according to various aspects.

DESCRIPTION

Figure 1:
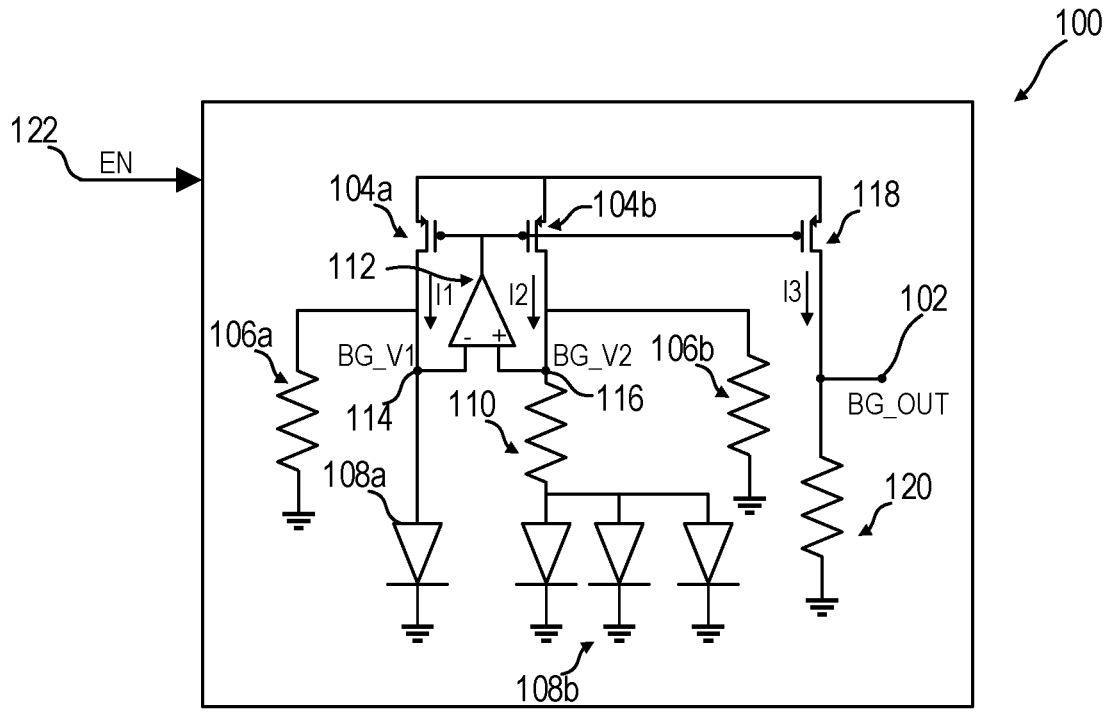
FIG. 1 shows a bandgap reference circuit in a schematic view, according to various aspects.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods (e.g., a method of operating a startup circuit, or a method of starting up a bandgap reference circuit) and various aspects are described in connection with devices (e.g., a startup circuit, a bandgap reference circuit, or a system including a startup circuit and a bandgap reference circuit). However, it may be understood that aspects described in connection with methods may similarly apply to the devices, and vice versa.

The generation of accurate reference voltages that remain stable over a range of operating conditions is a requisite for the operation of various types of digital and analog circuits. As an example, considering memory-related applications, the value of a readout voltage of a memory cell may be compared against a reference voltage value to determine a memory state the memory cell is residing in (e.g., a logic "0" or a logic "1" depending on whether the readout voltage value is less than or greater than the reference voltage value). The accuracy of the reference voltage generation may thus have an impact on the performance of the digital and analog circuits (e.g., on the accuracy of a memory readout), and the reference voltages should ideally remain stable over a range of operating conditions (e.g., should remain at a same voltage value for varying temperature, etc.).

According to various aspects, a circuit for generating a reference voltage may be or may include a bandgap reference circuit. The configuration and the operation of a bandgap reference circuit may be in general known in the art; a brief description is provided herein to discuss the aspects relevant to the present disclosure. A bandgap reference circuit (see also FIG. 1) may be configured to provide an output voltage with zero or substantially zero temperature drift by combining with one another voltage components having temperature drifts that cancel each another. A first voltage component may be complementary-to-absolute-temperature (CTAT), and may have a voltage value that decreases for increasing temperature, and a second voltage component may be proportional-to-absolute-temperature (PTAT), and may have a voltage value that increases for increasing temperature. The first voltage component and the second voltage component may thus have temperature drifts (also referred to as temperature coefficients) with opposite sign, so that combining (e.g., summing) the first voltage component and the second voltage component with one another may provide an output voltage substantially independent of temperature variations. Illustratively, the positive and negative dependency from the temperature may cancel each other to provide an output voltage with zero temperature drift. A bandgap reference circuit may be well suited for applications in which a low bandgap reference voltage (e.g., less than 3 V or less than 1.5 V) is to be provided, such as, for example, memory-related applications. A bandgap reference circuit may also be referred to herein as bandgap circuit.

A bandgap reference circuit may have two stable operating states (also referred to herein as operational states, operating points, or simply as states): a non-desired operating state in which the output voltage is zero, and a desired operating state in which the output voltage is at a predefined output voltage value (e.g., a desired reference voltage value, for example about 1.2 V). The non-desired stable operating state may be understood as an off-state (or stable off-state) of the bandgap reference circuit, in which no bandgap reference voltage is provided. The desired stable operating state may be understood as an on-state (or stable on-state) of the bandgap reference circuit, in which the output voltage is at the predefined output voltage value. Illustratively, the off-state may be understood as a first operating state of the bandgap reference circuit, with output voltage at 0 V, and the on-state may be understood as a second operating state of the bandgap reference circuit, with output voltage at the predefined output voltage value.

To ensure that the bandgap reference circuit reaches the on-state, a startup circuit may be coupled with (or integrated with) the bandgap reference circuit. The startup circuit may be configured to provide a startup signal (e.g., a startup voltage or a startup current) at the bandgap reference circuit to push the bandgap reference circuit out from the stable off-state and into the desired stable on-state, as described in further detail below. The startup circuit may provide a startup signal to trigger the bandgap functionality of the bandgap reference circuit, so that the bandgap reference circuit provides the desired reference voltage as output.

A conventional startup circuit may be configured to provide the startup signal at the bandgap reference circuit for a predefined time period, illustratively a time period long enough to ensure that the bandgap reference circuit reaches the desired stable operating state. A conventional startup circuit may continue providing the startup signal for the whole duration of the predefined time period, even after the bandgap reference circuit has reached the stable on-state. Illustratively, in a conventional configuration a startup pulse may be provided for a specific duration of enough time to ensure the working of the bandgap. As another example, a conventional startup circuit may provide the startup signal at the bandgap reference circuit until the output voltage of the bandgap reference circuit reaches the predefined output voltage value.

Various aspects of the present disclosure are based on the realization that conventional designs for startup circuits may be inefficient from the point of view of power consumption. Illustratively, a startup circuit designed according to a conventional configuration may provide the startup signal at the bandgap reference circuit for an unnecessarily long period of time.

Various aspects of the present disclosure are based on the realization that it is not necessary to keep providing a startup signal at a bandgap reference circuit until the end of a predefined time period or until the output voltage of the bandgap reference circuit reaches the predefined output voltage value. Various aspects are based on the realization that it may rather be sufficient to provide a startup signal at a bandgap reference circuit only until the bandgap reference circuit reaches a startup condition from which the bandgap reference circuit will evolve into the desired on-state. Illustratively, it was found that upon reaching a certain startup condition (under the influence of a startup signal), the bandgap reference circuit will evolve towards the on-state rather than going back to the off-state, even without maintaining the startup signal provided thereto. Thus, a startup circuit according to the present disclosure may be configured to provide a startup signal until a certain startup condition of the bandgap reference circuit is detected, which is indicative of an evolution of the bandgap reference circuit towards the stable on-state (e.g., of the evolution being triggered). Illustratively, in a configuration as described herein, startup to the bandgap may be automatically generated internally and may be stopped once the bandgap has started.

A startup condition may be understood as a condition of the bandgap reference circuit during startup. Illustratively, a startup condition may be understood as an intermediate operating state of the bandgap reference circuit between the non-desired off-state and the desired on-state. During startup, the bandgap reference circuit may go through a series of startup condition (illustratively, a series of intermediate operating states, while the startup signal is provided at the bandgap reference circuit), going from the off-state towards the on-state.

A startup circuit as described herein may be configured to stop providing the startup signal at an earlier time point compared to conventional startup circuit configurations, while still ensuring a proper triggering of the bandgap functionality, thus providing a more energy efficient operation. A startup circuit as described herein may be for use, as an example, in miniaturized circuits or in arrangements in which a low power consumption is desirable (e.g., in a memory cell arrangement). A startup circuit as described herein may be understood as a smart startup circuit, in various aspects.

According to various aspects, a (smart) startup circuit may be configured to provide a startup signal at a bandgap reference circuit, until the startup circuit receives a feedback signal (e.g., a feedback current or a feedback voltage) indicating that the bandgap reference circuit has reached a startup condition from which the bandgap reference circuit will evolve into a desired stable on-state (e.g., a condition including a voltage value of a voltage at an input terminal of an operational amplifier of the bandgap reference circuit being equal to or greater than a target voltage value, as described in further detail below). Illustratively, the startup circuit may be configured to provide the startup signal at a bandgap reference circuit, until the startup circuit receives a feedback signal indicating that the bandgap reference circuit has reached a startup condition that triggers the stable on-state of the bandgap reference circuit (e.g., that triggers an evolution of the bandgap reference circuit towards the stable on-state).

According to various aspects, a startup circuit may be configured to stop providing a startup signal at a bandgap reference circuit as soon as the bandgap reference circuit is in a startup condition from which the bandgap reference circuit will evolve into the stable on-state.

According to various aspects, a startup circuit for a bandgap reference circuit may be provided, wherein a target voltage value is associated with the bandgap reference circuit, the target voltage value being indicative of a startup condition of the bandgap reference circuit that triggers a stable on-state of the bandgap reference circuit, wherein the startup circuit is configured to: provide a startup voltage at the bandgap reference circuit to trigger a start of an operation of the bandgap reference circuit; receive a feedback voltage, wherein the feedback voltage is representative of a startup condition of the bandgap reference circuit; and either increase the startup voltage at the bandgap reference circuit in the case that a voltage value of the feedback voltage is less than the target voltage value, or stop providing the startup voltage at the bandgap reference circuit in the case that the voltage value of the feedback voltage is equal to or greater than the target voltage value.

According to various aspects, a startup circuit includes an output terminal and an input terminal, and the startup circuit is configured to: provide a startup voltage at the output terminal; receive a feedback voltage at the input terminal; and either increase the startup voltage at the output terminal in the case that a voltage value of the feedback voltage is less than a target voltage value, or stop providing the startup voltage at the output terminal in the case that the voltage value of the feedback voltage is equal to or greater than the target voltage value.

According to various aspects, a startup circuit for a bandgap reference circuit may be provided, the startup circuit including: a comparator circuit, wherein the comparator circuit includes a first input terminal, a second input terminal, and an output terminal, and wherein the comparator circuit is configured to: receive a feedback voltage at the first input terminal and a target voltage at the second input terminal, and provide at the output terminal a first output voltage representative of a first logic value in the case that a voltage value of the feedback voltage is equal to or greater than a voltage value of the target voltage, and provide at the output terminal a second output voltage representative of a second logic value in the case that the voltage value of the feedback voltage is less than the voltage value of the target voltage; wherein the startup circuit is configured to: either increase the startup voltage in response to the comparator circuit providing the second output voltage at the output terminal, or stop providing the startup voltage in response to the comparator circuit providing the first output voltage at the output terminal, wherein the voltage value of the feedback voltage being equal to or greater than the voltage value of the target voltage is indicative of a startup condition of the bandgap reference circuit that triggers a stable on-state of the bandgap reference circuit (e.g., that triggers an evolution of the bandgap reference circuit towards the stable on-state).

According to various aspects, a method of starting up a bandgap reference circuit may include: providing a startup signal at the bandgap reference circuit; and stop providing the startup signal at the bandgap reference circuit as soon as the bandgap reference circuit is in a startup condition that triggers a stable on-state of the bandgap reference circuit (e.g., as soon as a voltage value of a voltage at an input terminal of an operational amplifier of the bandgap reference circuit is equal to or greater than a target voltage value).

According to various aspects, a method of starting up a bandgap reference circuit may be provided, wherein a target voltage value is associated with the bandgap reference circuit, the target voltage value being indicative of a startup condition of the bandgap reference circuit that triggers a stable on-state of the bandgap reference circuit, the method including: providing a startup voltage at the bandgap reference circuit to trigger a start of an operation of the bandgap reference circuit; receiving a feedback voltage representative of a startup condition of the bandgap reference circuit; comparing a voltage value of the feedback voltage with the target voltage value; and either increasing the startup voltage at the bandgap reference circuit in the case that the voltage value of the feedback voltage is less than the target voltage value, or stop providing the startup voltage at the bandgap reference circuit in the case that the voltage value of the feedback voltage is equal to or greater than the target voltage value.

According to various aspects, a method of operating a startup circuit may include: providing a startup signal (e.g., at an output terminal of the startup circuit); receiving a feedback signal representative of a startup condition of the bandgap reference circuit; and stop providing the startup signal in the case that the feedback signal indicates a startup condition of the bandgap reference circuit that triggers a stable on-state of the bandgap reference circuit.

It is understood that in the context of the present disclosure the operation of a startup circuit may be described with particular reference to the operation of a bandgap reference circuit, but a startup circuit as described herein may be for use also in other types of applications, e.g. to start up other types of circuits.

The term "voltage" may be used herein with respect to "a startup voltage", "a feedback voltage", "a bandgap voltage", "an output voltage", a "base voltage" and the like. As an example, the term "startup voltage" may be used herein to denote a voltage provided by a startup circuit. As another example, the term "base voltage" may be used herein to denote a base voltage and/or a base potential for a circuit (e.g., a bandgap reference circuit and/or a startup circuit). With respect to an electrical circuit, the base voltage may be also referred to as ground voltage, ground potential, virtual ground voltage, or zero volts (0 V). The base voltage of an electrical circuit may be defined by the power supply used to operate the electronic circuit. A voltage provided at a terminal of a circuit may be defined by the respective potential applied to that terminal relative to the base voltage (referred to as VB) of the circuit.

In some aspects, two voltages may be compared with one another by relative terms such as "greater", "higher", "lower", "less", or "equal", for example. It is understood that, in some aspects, a comparison may include the sign (positive or negative) of the voltage value or, in other aspects, the absolute voltage values (also referred to as the magnitude, or as the amplitude, e.g. of a voltage pulse) may be considered for the comparison. The same may apply in a corresponding manner for a comparison of two currents with one another. A voltage value of a voltage may be understood as a value of that voltage with respect to a base voltage for the circuit (e.g., with respect to ground, or 0 V). A voltage value may also be referred to herein as voltage level.

FIG. 1 shows a bandgap reference circuit 100 in a schematic view according to various aspects. The bandgap reference circuit 100 may be configured to provide (e.g., at an output terminal 102) an output voltage, BG_OUT, having a predefined voltage value (in the stable on-state). The output voltage, BG_OUT, may be understood as a reference voltage that is stable to variations in temperature (e.g., variations in the temperature of the circuit 100, or of the surroundings). The output voltage, BG_OUT, may also be referred to herein as reference voltage, bandgap voltage, or bandgap reference voltage. In some aspects, the bandgap reference circuit 100 may be configured to provide the output voltage, BG_OUT, in response to an enabling signal 122 (EN, also denoted herein as EN BG), received at the bandgap reference circuit 100. The enabling signal 122 may be understood as a control signal configured to enable (e.g., to allow) the bandgap reference circuit 100 to begin its operation. Illustratively, in the bandgap reference circuit 100 there may be two important voltages, BG_V1, BG_V2, which are set to 0 before the bandgap is enable (in the off-state). As soon as bandgap is enable, these two voltages, BG_V1, BG_V2, should be set to proper value in order to start the bandgap functionality.

It is understood that the configuration of the bandgap reference circuit 100 shown in FIG. 1 (the specific components and the specific arrangement of the components) is exemplary, to illustrate the operation of a bandgap reference circuit (e.g., including an operational amplifier), and other configurations (e.g., with additional, less, or alternative components) may be provided, as known in the art. It is also understood that the aspects described herein in relation to a bandgap reference circuit configured to provide a reference voltage may apply in a corresponding manner to a bandgap reference circuit configured to provide a reference current.

By way of illustration, the bandgap reference circuit 100 may be configured to generate the output voltage, BG_OUT, as a combination of two voltage components. A first voltage component of the two voltage components may the base-emitter voltage of a bipolar junction transistor (BJT) (e.g., a first bipolar junction transistor 108a), which has a negative temperature coefficient. A second voltage component of the two voltage components may be the thermal voltage, which has a positive temperature coefficient, and which may be provided by the difference between the base-emitter voltages of (diode connected) bipolar junction transistors 108a, 108b. The bandgap reference circuit 100 may be configured to amplify the thermal voltage by a temperature independent constant, such that the amplified positive temperature coefficient of the thermal voltage and the negative temperature coefficient of the base-emitter voltage compensate one another, as known in the art.

In the exemplary configuration in FIG. 1, the bandgap reference circuit 100 may include a first branch with a first field-effect transistor 104a, a first resistor 106a, and a first bipolar junction transistor 108a (which is diode connected, and represented as a diode). The first resistor 106a and the first bipolar junction transistor 108a may be connected in parallel with one another. The base-emitter voltage of the first bipolar junction transistor 108a may be a first voltage component to provide the output voltage, BG_OUT.

The bandgap reference circuit 100 may further include a second branch with a second field-effect transistor 104b, a second resistor 106b, and one or more second (diode connected) bipolar junction transistors 108b. The second resistor 106b and the one or more second bipolar junction transistors 108b may be connected in parallel with one another. The second resistor 106b and the first resistor 106a may be equal to one another (e.g., may have a same resistance). The one or more second bipolar junction transistors 108b may be configured such that an emitter area ratio, M, may be provided between an emitter area of the one or more second bipolar junction transistors 108b and an emitter area of the first bipolar junction transistor 108a. Illustratively, the number and the individual emitter areas of the one or more second bipolar junction transistors 108b may be selected to provide the desired emitter area ratio, M. A current in a third resistor 110 may thus be proportional to the emitter area ratio, M, between the first bipolar junction transistor 108a and the one or more second bipolar junction transistors 108b, and may be directly proportional to the absolute temperature (that is, the current in the third resistor 110 may increase for increasing temperature). The voltage over the third resistor 110 may thus be a second voltage component to provide the output voltage, BG_OUT.

The bandgap reference circuit 100 may further include an operational amplifier 112 including two input terminals, e.g. an inverting terminal 114 and a non-inverting terminal 116. The operational amplifier 112 may be configured such that a first voltage, BG_V1, at the inverting terminal 114 and a second voltage, BG_V2, at the non-inverting terminal 116 are equal to one another (e.g., the operational amplifier 112 may have a unitary gain). The first voltage, BG_V1, may be understood as a voltage of the first branch of the bandgap reference circuit 100, and the second voltage, BG_V2, may be understood as a voltage of the second branch of the bandgap reference circuit 100.

The operational amplifier 112 may be configured such that, in operation, a first current, I1, in the first branch of the bandgap reference circuit 100 is equal to a second current, I2, in the second branch of the bandgap reference circuit 100. The first current, I1, and the second current, I2, may be equal to a third current, I3, flowing in an output branch of the bandgap reference circuit 100. The output branch may include a third field-effect transistor 118, and an output resistor 120. The third current, I3, may flow in the third field-effect transistor 118, to provide the output voltage, BG_OUT, at the output terminal 102, over the output resistor 120.

In operation, the bandgap reference circuit 100 (illustratively, the loop defined by the operational amplifier 112) has a stable operating state (the stable on-state) in which the first current, I1, and the second current, I2, are equal to one another and at a current value (or in an operating current range) that provides the desired output voltage, BG_OUT (illustratively, as third current, I3, over the output resistor 120). However, since the bandgap reference circuit 100 has a self-biased configuration, there is also another stable operating state (the stable off-state), in which the first current, I1, and the second current, I2, are equal to one another and are equal to 0 A. In this other (non-desired) stable operating state, the output voltage, BG_OUT, is not at the desired voltage value.

Illustratively, in the off-state, the first voltage, BG_V1, and the second voltage, BG_V2, at the input terminals of the operational amplifier 112 may be zero, whereas in the on-state, the first voltage, BG_V1, and the second voltage, BG_V2, may be at a voltage value (or in an operating voltage range) that provides the predefined output voltage, BG_OUT, at the output terminal 102 (an output voltage at a predefined output voltage value, for example a voltage value in the range from 0.75 V to 1.5 V). Illustratively, the stable off-state of the bandgap reference circuit 100 may be understood as a first operating state associated with an output voltage of 0 V, and the stable on-state of the bandgap reference circuit 100 may be understood as a second operating state associated with a predefined output voltage of the bandgap reference circuit 100.

The stable on-state may be associated with an operating current range and/or with an operating voltage range. The operating current range may include a range of current values for the first current, I1, and the second current, I2, such that in the case that the first current, I1, and the second current, I2, have a current value in the operating current range, the output voltage, BG_OUT, is at the predefined voltage value. Illustratively, the operating current range may include a range of operating currents indicative of a desired stable operation of the bandgap reference circuit 100. The operating voltage range may include a range of voltage values for the first voltage, BG_V1, and the second voltage, BG_V2, such that in the case that the first voltage, BG_V1, and the second voltage, BG_V2, have a voltage value in the operating voltage range, the output voltage, BG_OUT, is at the predefined voltage value. Illustratively, the operating voltage range may include a range of operating voltages indicative of a desired stable operation of the bandgap reference circuit 100.

According to various aspects, a startup circuit may be provided to bring the bandgap reference circuit 100 into the stable on-state, in which the first current, I1, and the second current, I2, have a current value in the operating current range, and the first voltage, BG_V1, and the second voltage, BG_V2, have a voltage value in the operating voltage range. The startup circuit may be configured to provide a startup signal (e.g., inject a startup current or provide a startup voltage) at one of the first branch or the second branch of the bandgap reference circuit 100 to bring the bandgap reference circuit 100 out from the stable off-state and into the stable on-state.

Various aspects may be based on the realization that it is not necessary to provide a startup signal at the bandgap reference circuit 100 for as long as the voltages, BG_V1, BG_V2 in the first branch and the second branch do not reach the operating voltage range (or as long as the currents, I1, I2, do not reach the operating current range). The voltages, BG_V1, BG_V2 reaching the operating voltage range may be understood as a respective value of the voltages BG_V1, BG_V2 being equal to or greater than an operating voltage value (e.g., the minimum value of the operating voltage range). Similarly, the currents, I1, I2 reaching the operating current range may be understood as a respective value of the currents I1, I2 being equal to or greater than an operating current value (e.g., the minimum value of the operating current range).

Rather it was found that it may be sufficient to provide the startup signal at the bandgap reference circuit 100 as long as the voltages, BG_V1, BG_V2 in the first branch and the second branch do not reach a certain voltage value (illustratively, a target voltage value, also referred to herein as threshold voltage value), less than the operating voltage value (or as long as the currents, I1, I2, reach a certain current value less than the operating current value). The configuration of the bandgap reference circuit 100 (the loop defined by the operational amplifier 112) may ensure that as soon as the voltages, BG_V1, BG_V2, reach such target voltage value, the bandgap reference circuit 100 will evolve towards the stable on-state (with the output voltage, BG_OUT, at the predefined voltage value). Illustratively, in the case that the voltages BG_V1, BG_V2 are equal to or greater than the target voltage value, the bandgap reference circuit 100 will evolve towards the desired on-state rather than towards the non-desired off-state (e.g., the voltages BG_V1, BG_V2 will reach the operating voltage range). The voltages BG_V1, BG_V2 being equal to or greater than the target voltage value may be understood as the voltages BG_V1, BG_V2 being in a target voltage range (including voltage values less than each of the voltage values of the operating voltage range). It is understood that the aspects described in relation to the voltages BG_V1, BG_V2 being equal to or greater than the target voltage value may apply in a similar manner to the currents I1, I2 being equal to or greater than the target current value.

The target voltage value (or the target current value) may thus be indicative of a startup condition of the bandgap reference circuit 100 that triggers the stable on-state of the bandgap reference circuit (illustratively, that leads to the stable on-state of the bandgap reference circuit 100). The target voltage value may be representative of a startup condition of the bandgap reference circuit 100 that indicates that the bandgap reference circuit 100 will reach the stable on-state. Illustratively, the target voltage value may be representative of a startup condition that triggers an evolution of the voltage(s), BG_V1, BG_V2, at the inverting and non-inverting terminal 114, 116 of the operational amplifier 112 towards the operating voltage value (e.g., towards a voltage value in the operating voltage range).

The target voltage value may be selected such that in the case that the voltages BG_V1, BG_V2 are equal to or greater than the target voltage value it may be determined that the bandgap reference circuit 100 will reach the stable on-state in which the voltages BG_V1, BG_V2 are in the operating voltage range (and the currents I1, I2 are in the operating current range). The target voltage value may be greater than 0 V and may be less than the bandgap voltage provided by the bandgap reference circuit 100 (e.g., may be less than the predefined voltage value of output voltage, BG_OUT, provided by the bandgap reference circuit 100 in the on-state). Only as a numerical example, the target voltage value may be greater than 0 V and less than 1 V, for example greater than 0 V and less than 0.75 V. It is however understood that the voltage value of the target voltage may be adapted in accordance with the configuration of the bandgap reference circuit 100.

Various aspects of the present disclosure are related to a smart startup circuit configured in accordance with the aspects described above. The startup circuit described herein may provide a more energy efficient operation compared to conventional startup circuit designs. The smart startup circuit will be described in further detail below, for example with reference to FIG. 2 to FIG. 6B.

Figure 2:
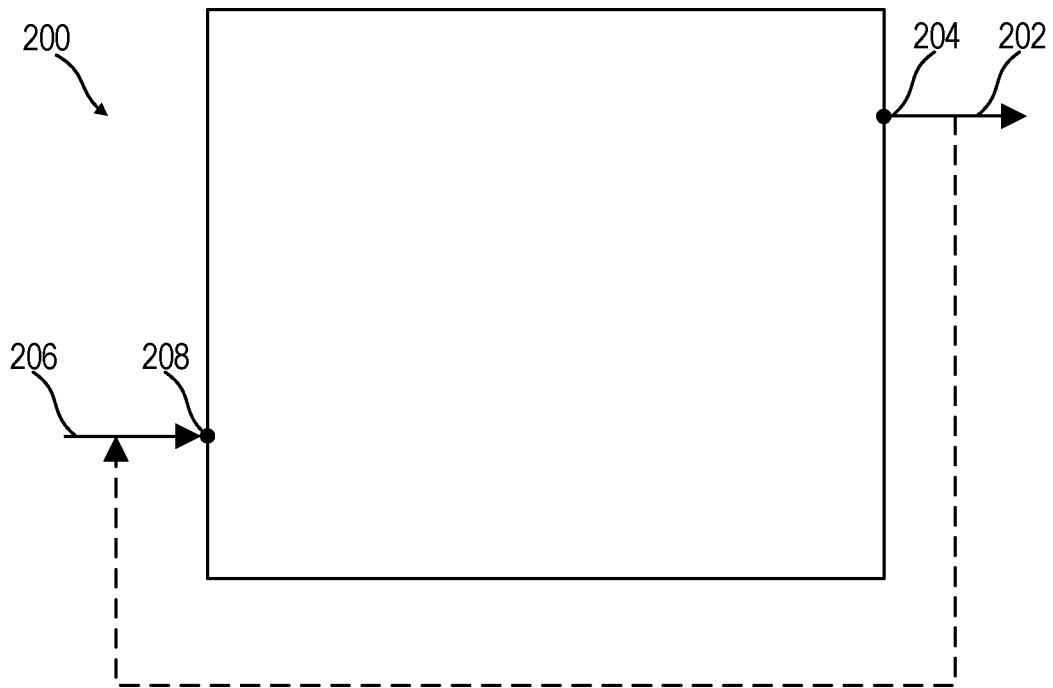
FIG. 2 shows a startup circuit in a schematic view, according to various aspects.

FIG. 2 shows a startup circuit 200 in a schematic view, according to various aspects. The startup circuit 200 may be for a bandgap reference circuit (e.g., for the bandgap reference circuit 100, see also FIG. 3). Illustratively, the startup circuit 200 may be configured to provide a startup signal at a bandgap reference circuit. The startup circuit 200 may be understood as a smart startup circuit.

In the following, the operation of the startup circuit 200 may be described in relation to a bandgap reference circuit and in relation to the properties of a bandgap reference circuit (e.g., in relation to a target voltage value associated with the bandgap reference circuit). It is however understood that the applications of the startup circuit 200 are not limited to bandgap reference circuits, and that the startup circuit 200 may be for use to provide a startup signal at other types of circuits. Illustratively, the startup circuit 200 may be in general configured to provide a startup signal at another circuit (e.g., with a target voltage value associated therewith, representative of a startup condition to be reached) to start up an operation of the other circuit, and the aspects described herein in relation to the startup circuit 200 in combination with a bandgap reference circuit may apply in general to the startup circuit 200 in combination with another circuit.

A startup signal as described herein may be understood as an electrical signal (e.g., a current or a voltage) configured to initialize the operation of the bandgap reference circuit. A startup signal may thus be understood as an electrical signal configured to trigger a start of an operation of the bandgap reference circuit, e.g. to bring the bandgap reference circuit out from a stable off-state. By way of illustration, the idea of the startup circuit 200 is to give a push to another circuit to start proper functionality by setting the other circuit into a proper state. A startup signal may be or may include a startup current and/or a startup voltage. A current value of the startup current or a voltage value of the startup voltage may be selected according to a configuration of the bandgap reference circuit to which the startup signal is provided. In the following, various aspects may be described in relation to a startup voltage provided by the startup circuit 200. It is however understood that the aspects described in relation to a startup voltage may apply in a corresponding manner for a startup current, and vice versa.

Figure 3:
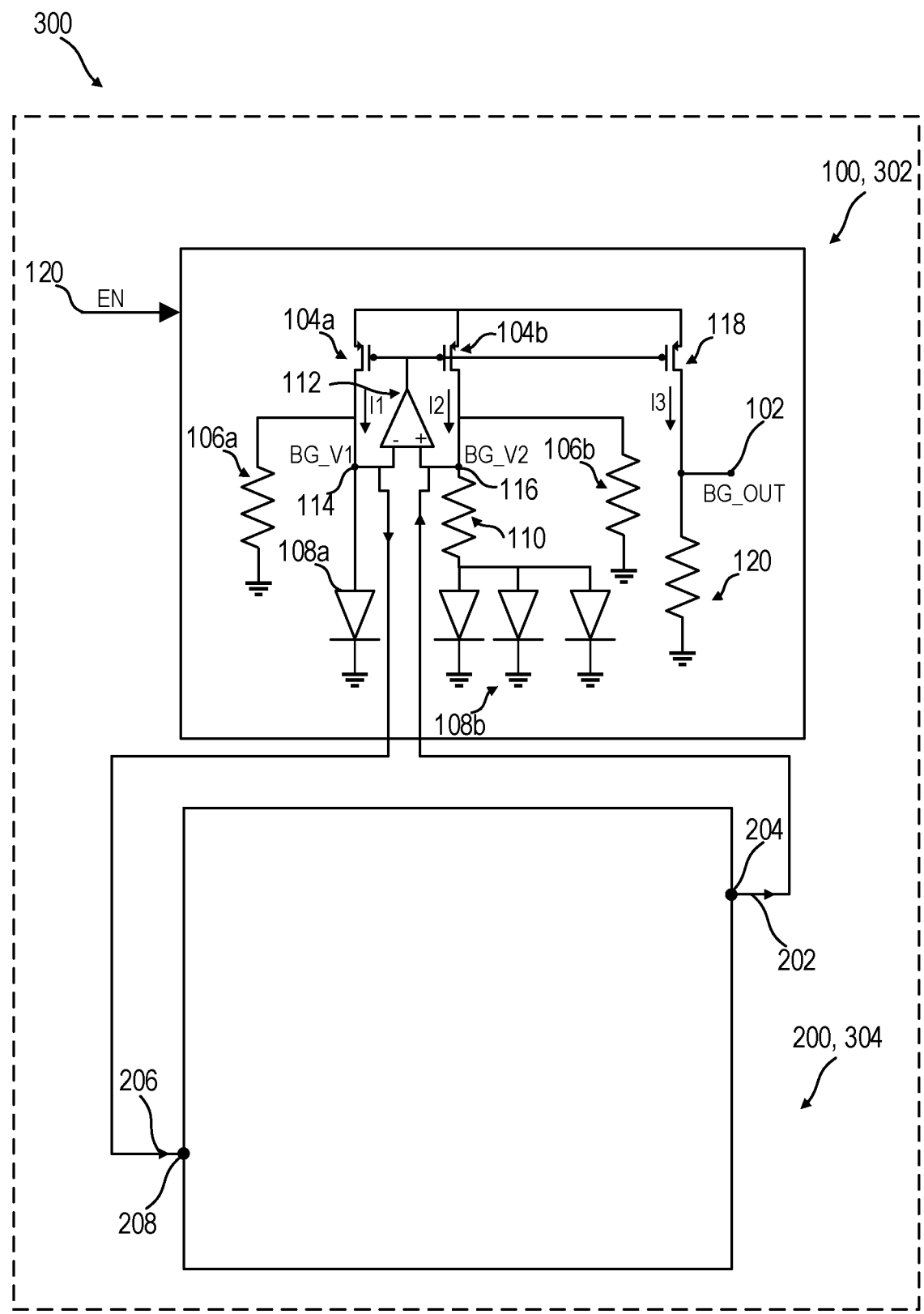
FIG. 3 shows a system including a bandgap reference circuit and a startup circuit in a schematic view, according to various aspects.

The startup circuit 200 may be configured to provide a startup voltage 202 to trigger a start of an operation of the bandgap reference circuit (e.g., of the bandgap reference circuit 100, see also FIG. 3). The startup circuit 200 may include an output terminal 204 (also referred to herein as startup terminal), and may be configured to provide the startup voltage 202 at the output terminal 204. The output terminal 204 may be connectable with the bandgap reference circuit to which the startup voltage 202 is to be provided, e.g. may be connectable with an input terminal (e.g., the non-inverting terminal) of an operational amplifier of the bandgap reference circuit (see also FIG. 3).

The startup circuit 200 may be configured to operate in accordance with a startup condition of the bandgap reference circuit to which the startup circuit 200 provides the startup voltage 202. The startup circuit 200 may be configured to receive a feedback voltage 206 representative of a startup condition of the bandgap reference circuit to which the startup circuit 200 provides the startup voltage 202. Illustratively, the feedback voltage may be representative of an evolution of the bandgap reference circuit from the stable off-state of the bandgap reference circuit towards the stable on-state of the bandgap reference circuit.

The startup circuit 200 may include an input terminal 208 (also referred to herein as feedback terminal), and may be configured to receive the feedback voltage 206 at the input terminal 208. The feedback voltage 206 may be associated with the startup voltage 202 (as represented by the dotted arrow in FIG. 2). Illustratively, the startup voltage 202 may bring the bandgap reference circuit into a startup condition that is represented by the feedback voltage 206. The input terminal 208 may be connectable with the bandgap reference circuit to which the startup voltage 202 is to be provided, e.g. may be connectable with an input terminal (e.g., the inverting terminal) of an operational amplifier of the bandgap reference circuit (see also FIG. 3).

The startup circuit 200 may be configured to control the startup voltage 202 (at the output terminal 204) as a function of the feedback voltage 206 (at the input terminal 208). The startup circuit 200 may be configured to control the startup voltage 202 as a function of a comparison between a voltage value of the feedback voltage 206 and the target voltage value associated with the bandgap reference circuit.

The startup circuit 200 may be configured to either increase the startup voltage 202 (at the bandgap reference circuit) in the case that the voltage value of the feedback voltage (also referred to herein as feedback voltage value) is less than the target voltage value, or to stop providing the startup voltage (at the bandgap reference circuit) in the case that the voltage value of the feedback voltage is equal to or greater than the target voltage value.

The voltage value of the feedback voltage being equal to or greater than the target voltage value may be indicative of a startup condition of the bandgap reference circuit that triggers the stable on-state of the bandgap reference circuit. Illustratively the feedback voltage 206 being equal to or greater than the target voltage value may be indicative of a startup condition that provides an evolution of the bandgap reference circuit towards the stable on-state. As an example (see also FIG. 3), the feedback voltage 206 received at the startup circuit 200 may include (or may be representative of) a voltage at an input terminal (e.g., at the inverting terminal) of an operational amplifier of the bandgap reference circuit.

The startup voltage 202 may be adapted in accordance with the use of the startup circuit 200 (e.g., in accordance with the bandgap reference circuit to which the startup circuit 200 provides the startup voltage 202). The startup voltage 202 may have a voltage value (also referred to herein as startup voltage value) in a startup voltage range. The startup voltage range may be associated with the bandgap reference circuit, e.g. may be selected to provide that the bandgap functionality of the bandgap reference circuit is triggered. The startup circuit 200 may be configured to increase the startup voltage 202 (based on the feedback voltage value) within the startup voltage range, e.g., starting from a minimum voltage value of the startup voltage range up to a maximum value of the startup voltage range. Illustratively, the startup voltage range may include voltage values configured to start a bandgap functionality in a bandgap reference circuit.

FIG. 3 shows a system 300 including a bandgap reference circuit 302 and a startup circuit 304 in a schematic view, according to various aspects. The bandgap reference circuit 302 may be configured as the bandgap reference circuit 100 described in relation to FIG. 1, and the startup circuit 304 may be configured as the startup circuit 200 described in relation to FIG. 2. It is understood that the configuration of the bandgap reference circuit 302 and the startup circuit 304 may be exemplary, and other configurations may be provided to implement the aspects described herein. The system 300 may be understood as a circuit configured to provide a bandgap voltage in an energy efficient manner. Illustratively, the system 300 with a bandgap reference circuit 302 and a startup circuit 304 may be understood as a bandgap reference circuit with an integrated smart startup functionality.

The startup circuit 304 and the bandgap reference circuit 302 may be coupled with one another. The startup circuit 304 may be configured to provide the startup voltage 202 at the bandgap reference circuit 302, to trigger a start of an operation of the bandgap reference circuit 302 (illustratively, to trigger a bandgap functionality of the bandgap reference circuit 302). The startup circuit 304 may be configured to receive a feedback voltage 206 from the bandgap reference circuit 302.

The coupling between the startup circuit 304 and the bandgap reference circuit 302 may be at the input terminals of the operational amplifier 112 of the bandgap reference circuit 302. One of the inverting terminal 114 or the non-inverting terminal 116 of the operational amplifier 112 may be coupled (e.g., electrically conductively connected) with the output terminal 204 of the startup circuit 304, and the other one of the inverting terminal 114 or the non-inverting terminal 116 may be coupled with the input terminal 208 of the startup circuit 304. Stated in a different fashion, one of the inverting terminal 114 or the non-inverting terminal 116 of the operational amplifier 112 may be configured to receive the startup voltage 202 provided by the startup circuit 304, and the startup circuit 304 may be configured to receive the voltage at the other one of the inverting terminal 114 or the non-inverting terminal 116 of the operational amplifier 112 as feedback voltage 206.

The monitoring of the voltage at the input terminal of the operational amplifier 112 provides an energy efficient (and time efficient) strategy for determining when to stop providing the startup voltage 202, as described above (e.g., more efficient than monitoring the output voltage of the bandgap reference circuit 302). It is however understood that other coupling configurations may be possible, which allow providing the startup voltage 202 to start the operation of the bandgap reference circuit 302 and to allow providing the feedback voltage 206 at the startup circuit 304.

The configuration of the bandgap reference circuit 302 (illustratively, the loop defined by the operational amplifier 112) may be such that upon the startup voltage 202 being provided at one of the inverting terminal 114 or the non-inverting terminal 116 of the operational amplifier 112 (e.g., at the non-inverting terminal 116 in the exemplary configuration in FIG. 3), the voltage value at the other one of the inverting terminal 114 or the non-inverting terminal 116 of the operational amplifier 112 increases in accordance with the voltage value of the startup voltage 202. Illustratively, the operational amplifier 112 may equalize the two voltages, BG_V1, BG_V2, at the input terminals 114, 116 as described in relation to FIG. 1. In the configuration in FIG. 3, the operational amplifier 112 may illustratively bring the voltage, BG_V1, at the inverting terminal 114 to be at the same voltage value as the voltage, BG_V2, (charged up by the startup voltage 202) at the non-inverting terminal 116.

Monitoring over time the voltage value at the other one of the input terminals of the operational amplifier 112 with respect to the input terminal at which the startup voltage 202 is provided may thus provide monitoring the startup condition of the bandgap reference circuit 302. Considering the configuration in FIG. 3, comparing over time the voltage value of the voltage, BG_V1, at the inverting terminal 114 (as feedback voltage 206 at the startup circuit 304) with the target voltage value may provide determining when to stop providing the startup voltage 202 (illustratively, as soon as the voltage value of the voltage, BG_V1, at the inverting terminal 114 has increased to be equal to or greater than the target voltage value). As discussed in relation to FIG. 1, the bandgap reference circuit 302 may be configured such that in the case that the voltage values at the input terminals 114, 116 of the operational amplifier 112 are equal to or greater than the target voltage value, the bandgap reference circuit 302 evolves towards the stable on-state.

In the following, for example with relation to FIG. 4A to FIG. 6B, exemplary configurations of a startup circuit (e.g., of the components of a startup circuit) and of the operation of a startup circuit will be provided. It is understood that the configuration described herein is exemplary to illustrate the principles of the startup circuit described herein, and other configurations of a startup circuit (e.g., with additional, less, or alternative components) may be provided.

Figure 4A:
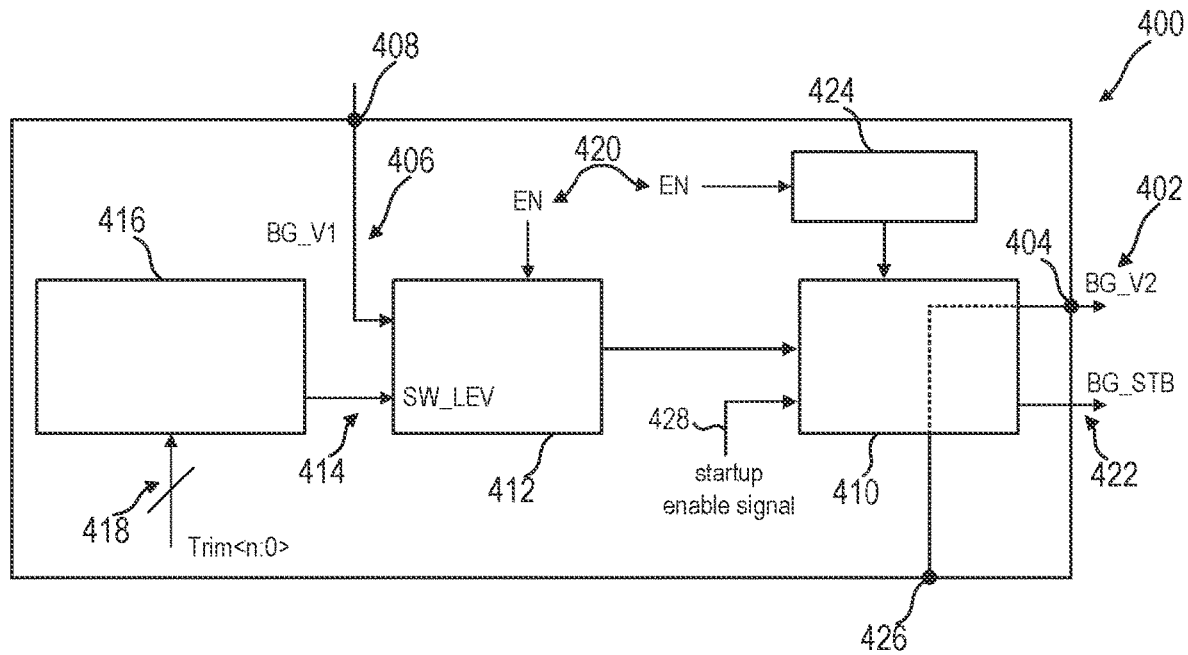
FIG. 4A shows an exemplary configuration of a startup circuit in a schematic view, according to various aspects.

FIG. 4A shows a startup circuit 400 in a schematic view, according to various aspects. The startup circuit 400 may be an exemplary configuration of the startup circuit 200, 302 described in relation to FIG. 2 and FIG. 3. The startup circuit 400 may be configured to provide a startup voltage 402 at an output terminal 404, e.g. as voltage, BG_V2, at an input terminal (e.g., the non-inverting terminal) of an operational amplifier of a bandgap reference circuit (e.g., of the bandgap reference circuit 100, 304). The startup circuit 400 may be configured to receive a feedback voltage 406 at an input terminal 408, e.g. as voltage, BG_V1, at the other input terminal (e.g., the inverting terminal) of an operational amplifier of a bandgap reference circuit (e.g., of the bandgap reference circuit 100, 304).

The startup circuit 400 may include a switch circuit 410 (see also FIG. 5A) configured to control a voltage value at the output terminal 404 (illustratively, a voltage value of the startup voltage). The switch circuit 410 may be switchable between a first state in which the startup voltage 402 at the output terminal 404 has a voltage value in the startup voltage range and/or a voltage value that increases within the startup voltage range, and a second state in which the voltage at the output terminal 404 is at a voltage value less than the startup voltage range, e.g. at 0 V or decreases to 0 V. The switch circuit 410 may also be referred to herein as charge-up switch.

As an exemplary configuration (see also FIG. 5A), the switch circuit 410 may be configured to control an electrical behavior of an electrically conductive path between a supply terminal 426 and the output terminal 404. The startup circuit 400 may be configured to receive a supply voltage (VDD) at the supply terminal 426, e.g. the supply terminal 426 may be coupled with a supply voltage source. The switch circuit 410 may be coupled between the supply terminal 426 and the output terminal 404 (e.g., between the supply terminal 426 and the bandgap reference circuit), and may be configured, in the first state, to connect the electrically conductive path between the supply terminal 426 and the output terminal 404 (to provide/increase the startup voltage 402), and, in the second state, to disconnect the electrically conductive path between the supply terminal 426 and the output terminal 404 (to stop providing the startup voltage 402). The switch circuit 410 may be configured to switch in the first state or the second state to connect or disconnect the electrically conductive path as a function of the voltage value of the feedback voltage 406, as described in further detail below.

In various aspects, the switch circuit 410 may be configured to receive a startup enabling signal 428 (also referred to herein as startup pulse). The switch circuit 410 may be configured to switch into the first state (to connect the electrically conductive path) in accordance with the startup enabling signal 428 (e.g., in response to the startup enabling signal 428 turning low). The startup enabling signal 428 may be understood as a control signal indicative of whether the startup voltage 402 should be provided. The startup enabling signal 428 may have a first value (e.g., a low value, for example corresponding to a low voltage value, such as 0 V, also referred to herein as low level) indicative that the startup voltage 402 should be provided, and a second value (e.g., a high value, for example corresponding to a high voltage value, greater than the low value, such as 1 V, also referred to herein as high level) indicative that the startup voltage 402 should not be provided. The switch circuit 410 may be configured to switch into the first state or the second state in accordance with the value of the startup enabling signal 428 (e.g., to remain in the first state or switch into the first state in the case that the startup enabling signal 428 has the first value, and to remain in the second state or switch into the second state in the case that the startup enabling signal 428 has the second value). While the startup enabling signal 428 of FIG. 4A is shown as an input to the switch circuit 410, it may also be determined within the switch circuit 410, an example of which is shown in more detail in FIG. 5A and discussed below. For example, to determine the startup enable signal, the switch circuit 410 may include a multiplexer that receives the output signal of a comparator circuit 412 and the output signal of a watchdog circuit 424, each of which is discussed in further detail below.

The startup circuit 400 may include a comparator circuit 412 (see also FIG. 5B) configured to compare the voltage value of the feedback voltage 406 with the target voltage value associated with the bandgap reference circuit. The comparator circuit 412 may be configured to receive the feedback voltage 406 and a target voltage 414 (SW_LEV) and compare the respective voltage values with one another. The comparator circuit 412 may be configured to provide an output voltage representative of the result of the comparison, and to provide the output voltage at the switch circuit 410. The switch circuit 410 may be configured to switch into the first state or second state based on the received output voltage (illustratively, based on the result of the comparison). Illustratively, the output voltage of the comparator circuit 412 may define the signal level of the startup enabling signal 428 to switch or maintain the switch circuit 410 into the first state or second state. In the case that the output voltage of the comparator circuit 412 indicates that the voltage value of the feedback voltage 406 is equal to or greater than the target voltage value, the switch circuit 410 may be configured to switch into the second state to stop providing the startup voltage 402 (at the output terminal 404), illustratively upon receiving a startup enabling signal 428 that brings the switch circuit 410 into the second state. In the case that the output voltage of the comparator circuit 412 indicates that the voltage value feedback voltage 406 is less than the target voltage value, the switch circuit 410 may be configured to remain into the first state to keep providing (and to increase) the startup voltage 402, illustratively upon receiving a startup enabling signal 428 that brings or maintains the switch circuit 410 into the first state. The comparator circuit 412 may also be referred to herein as comparator block.

The startup circuit 400 may include a trimmer circuit 416 (see also FIG. 5C) configured to generate a target voltage 414 representative of the target voltage associated with the bandgap reference circuit (illustratively, a voltage having a voltage value corresponding to the target voltage value associated with the bandgap reference circuit). The trimmer circuit 416 may be configured to provide the target voltage 414 at the comparator circuit 412. The trimmer circuit 416 may be configured to receive a control signal 418 (Trim<n: 0>, also referred to herein as trimmer signal), and may be configured to generate the target voltage 414 in accordance with the control signal 418, as described in further detail below. Illustratively, the control signal 418 may be representative of the voltage value that the target voltage 414 should have, and the trimmer circuit 416 may be configured to generate the target voltage 414 to have the voltage value represented by the control signal 418. The trimmer circuit 416 may also be referred to herein as trimmable switch level. The trimmer circuit 416 may thus provide adapting the operation of the startup circuit 400 to the bandgap reference circuit to which the startup voltage 402 is to be provided.

In various aspects, the startup circuit 400 may be configured to receive an enabling signal 420 (EN) indicative of the enablement of an operation of the bandgap reference circuit to which the startup circuit 400 should provide the startup voltage 402 (e.g., indicative of the enablement of the operation of the bandgap reference circuit coupled at the output terminal 404). The enabling signal 420 may be understood as a control signal configured to prompt the startup circuit 400 to start its operation. The enabling signal 420 may indicate that an operation of the bandgap reference circuit has been enabled, and that the start of the operation of the bandgap reference circuit should be triggered. The startup circuit 400 may be configured to start providing the startup voltage 402 (at the output terminal 404) in response to the enabling signal 420. As an example, the reception of the enabling signal 420 may provide that the startup enabling signal 428 turns into having the first (e.g., low) value. In the configuration in FIG. 4A, the comparator circuit 412 may be configured to receive the enabling signal 420 and may be configured to start comparing the feedback voltage 406 with the target voltage 414 in response to the enabling signal 420.

In various aspects, the startup circuit 400 may be further configured to provide an indicator signal 422 (BG_STB) (e.g., a voltage) indicative of a stable operation of the bandgap reference circuit to which the startup circuit 400 provides the startup signal 402 (e.g., indicative of the bandgap reference circuit being in the stable on-state). Illustratively, the startup circuit 400 may be configured to determine that the bandgap reference circuit is in the stable on-state (or will reach the stable on-state) based on the feedback voltage 406. The startup circuit 400 may be configured to provide the indicator signal 422 in response to the voltage value of the feedback voltage being equal to or greater than the target voltage value. The startup circuit 400 may be configured to provide the indicator signal 422 at one or more other circuits, whose operation may be associated with the stable operation of the bandgap reference circuit to which the startup circuit 400 provides the startup voltage 402.

In an exemplary configuration, the startup circuit 400 may include a delay stage (not shown in FIG. 4A, see also FIG. 5A and FIG. 6A) configured to impose a delay onto the providing of the indicator signal 422. The delay may be configured to ensure that the bandgap reference circuit has reached the stable on-state prior to providing that information to the one or more other circuits.

According to various aspects, the startup circuit 400 may further include a watchdog circuit 424. The watchdog circuit 424 may be configured to measure an operating time during which the startup circuit 400 is in operation to provide the startup voltage 402, and to instruct the startup circuit 400 to stop its operation in the case that the operating time exceeds a predefined period of time. The watchdog circuit 424 may be configured to receive the enabling signal 420, and to measure a time that elapses from the reception of the enabling signal 420. The watchdog circuit 424 may be configured to stop an operation of the startup circuit 400 (e.g., to force the startup circuit 400 to stop providing the startup voltage 402), after a predefined period of time has elapsed from the reception of the enabling signal 420 at the watchdog circuit 424. As an exemplary configuration, the watchdog circuit 424 may be configured to set the startup enabling signal 428 at the second (e.g., high) value in the case that the predefined period of time has elapsed, to instruct the switch circuit 410 to disconnect the electrically conductive path between the supply terminal 426 and the output terminal 404. Illustratively, the watchdog circuit 424 may be configured to provide a watchdog signal that is configured to maintain or bring the startup enabling signal 428 low (prior to the elapsing of the time period) or high (after the time period). The watchdog circuit 424 may thus ensure that unwanted scenarios in which the startup circuit 400 gets stuck in operation are avoided. The predefined period of time may be adapted according to the configuration of the startup circuit 400 and/or of the bandgap reference circuit to which the startup circuit 400 provides the startup voltage 402.

Figure 4B:
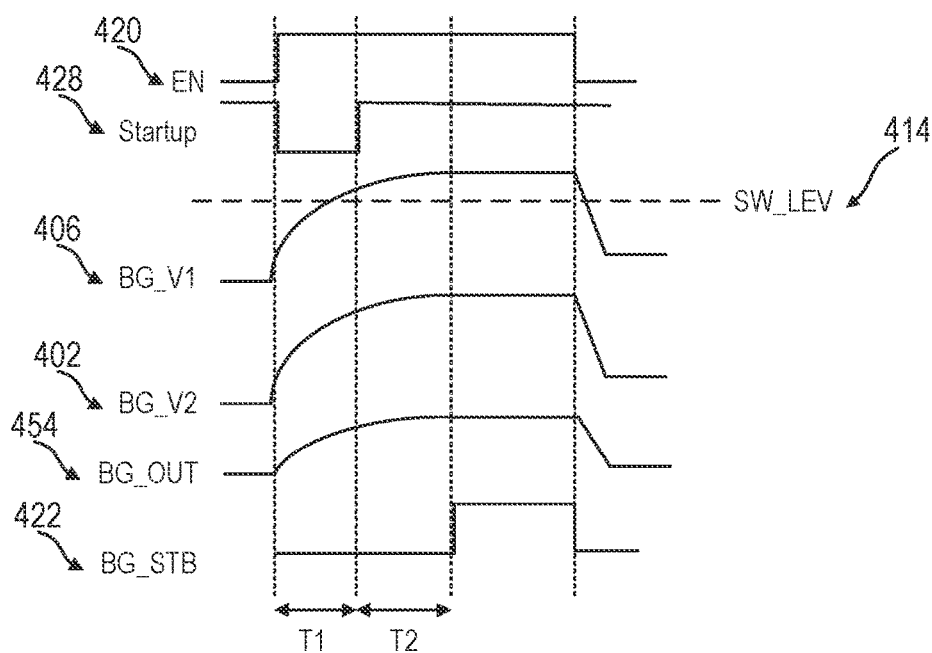
FIG. 4B shows schematically a time diagram associated with an operation of a startup circuit, according to various aspects.

FIG. 4B shows a schematic time diagram 450 illustrating an exemplary operation of the startup circuit 400, e.g. an exemplary evolution over time of the signals and voltages associated with the operation of the startup circuit 400 (and of the bandgap reference circuit to which the startup voltage 402 is provided).

When the enabling signal 420 is set to a high value (e.g., EN=1, e.g. a high logic value, for example corresponding to a high voltage value, such as 1 V, also referred to as high level), the startup enabling signal 428 is set to the low value and the startup circuit 400 may start its operation.

The startup circuit 400 may start charging up the startup voltage 402, e.g. through the switch circuit 410 (e.g., which in turns starts charging the voltage, BG_V2, at an input terminal of an operational amplifier of the bandgap reference circuit).

The feedback voltage 406 may follow the charging of the startup voltage 402 (e.g., the voltage, BG_V1, at the other input terminal of the operational amplifier follows the startup voltage, illustratively, BG_V1 will follow BG_V2 by the unity gain amplifier in the bandgap). The two voltages, BG_V1, BG_V2 may be probed and set into proper state to trigger bandgap functionality.

When the voltage value of the feedback voltage 406 becomes equal to or greater than the target voltage value 414, the startup enabling signal 428 may be set high to stop the charging of the output terminal 404 (and the charging of the input terminal of the operational amplifier of the bandgap reference circuit).

The level of the feedback voltage 406 (the level of BG_V1) at which the startup enabling signal 428 is turned to high may be set by the trimmer circuit 416 (and may be varied, as described in further detail below). The comparison between the feedback voltage 406 and the target voltage 414 may be carried out in the comparator circuit 412, as described above.

As shown in the time diagram 450, during a first time period T1, BG_V1 is charged up, and after a second time period T2, the bandgap may become stable (may be in the stable on-state, e.g. the output voltage 454, BG_OUT, of the bandgap reference circuit may be at the desired output voltage value). After the period T2, the indicator signal 422 may be generated (or set high) to indicate the bandgap stable condition. The indicator signal 422 may be used in other circuits which are dependent on bandgap to indicate to them that bandgap is stable and ready for use. The watchdog circuit 424 may be configured to watch the startup enabling signal 428, and to set it high in the case that the startup enabling signal 428 does not turn high after the predefined amount of time.

In the following, exemplary configurations of the components of a startup circuit (e.g., of the startup circuit 200, 400) will be described in relation to FIG. 5A to FIG. 5C. It is understood that the configurations described in relation to FIG. 5A to FIG. 5C are exemplary, and the components of a startup circuit may have alternative configurations to provide the same type of functionality.

Figure 5A:
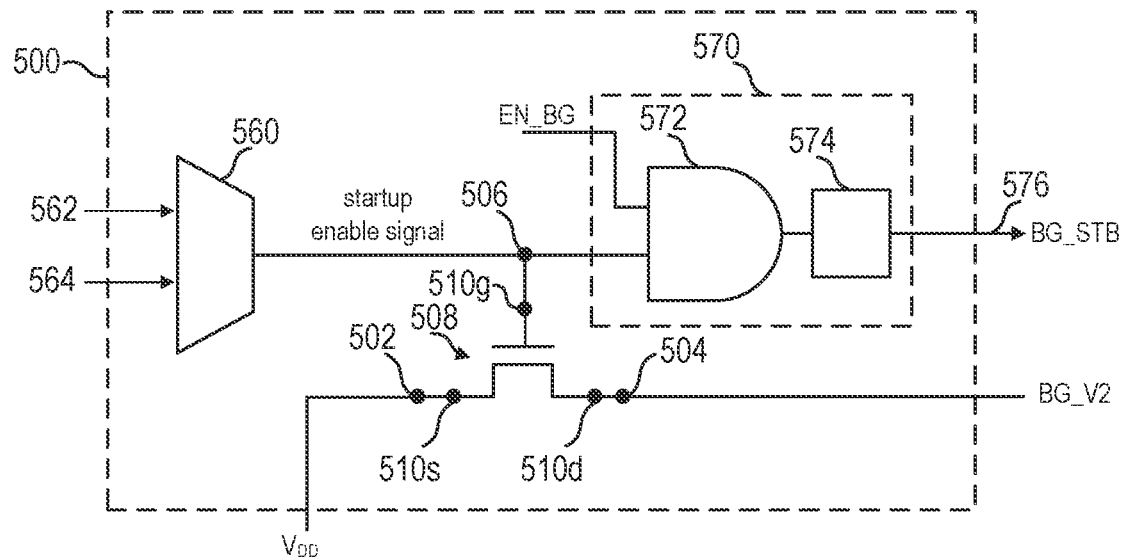
FIG. 5A shows an exemplary configuration of a switching circuit in a schematic view according to various aspects.
Figure 5B:
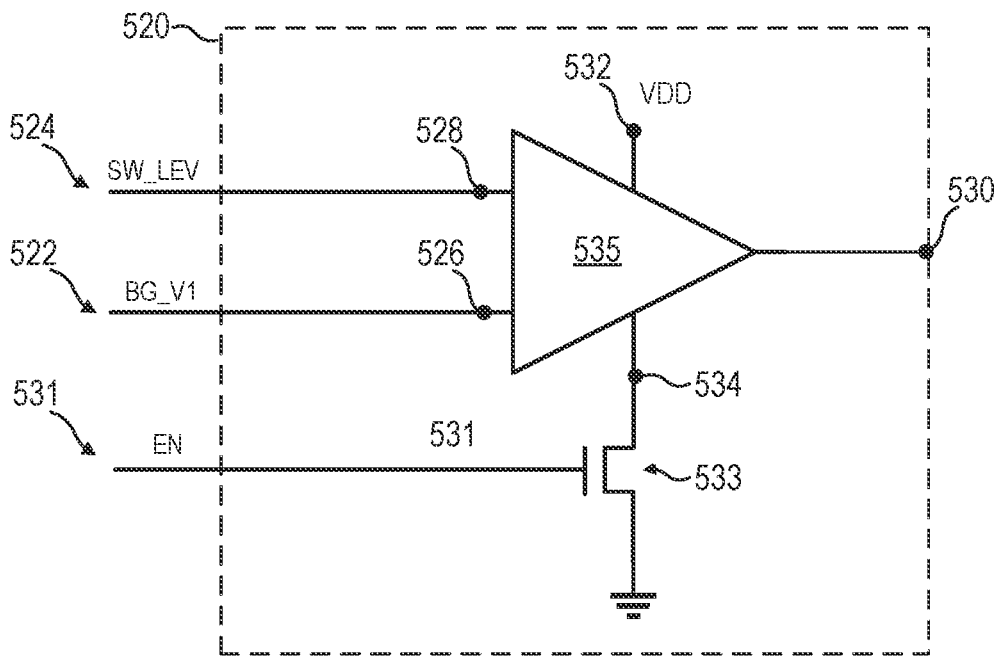
FIG. 5B shows an exemplary configuration of a comparator circuit in a schematic view according to various aspects.
Figure 5C:
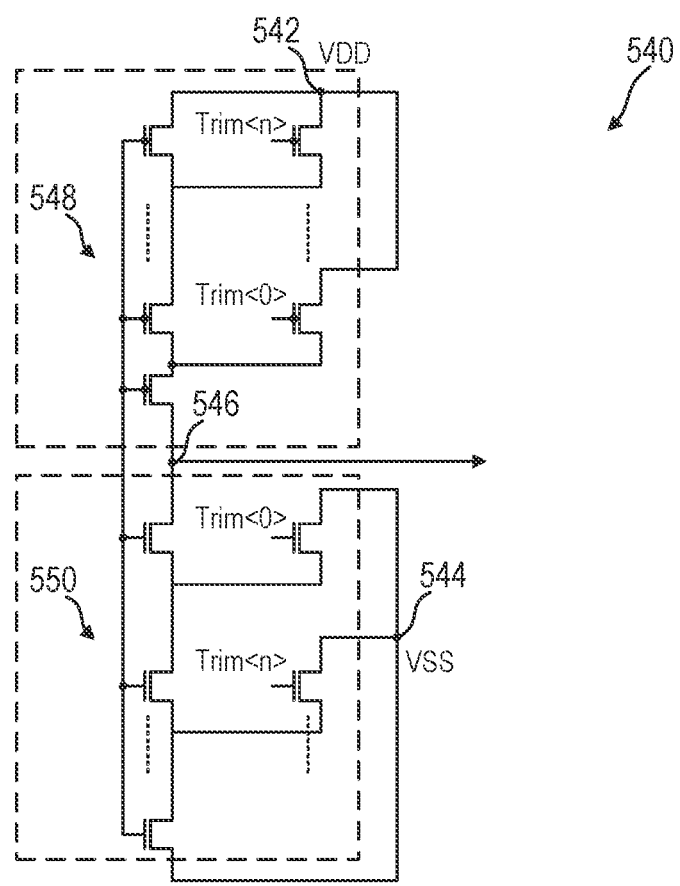
FIG. 5C shows an exemplary configuration of a trimmer circuit in a schematic view according to various aspects.

FIG. 5A shows a switch circuit 500 for a startup circuit in a schematic view, according to various aspects. The switch circuit 500 may be an exemplary configuration of the switch circuit 410 described in relation to FIG. 4A.

The switch circuit 500 may include a supply terminal 502, e.g. corresponding to the supply terminal of the startup circuit (e.g., the supply terminal 426) or connectable with the supply terminal of the startup circuit. The switch circuit 500 may be configured to receive a supply voltage (e.g., VDD) at the supply terminal 502. The switch circuit 500 may include an output terminal 504, e.g. corresponding to the output terminal of the startup circuit (e.g., the output terminal 404) or connectable with the output terminal of the startup circuit. The switch circuit 500 may include a control terminal 506, and may be configured to receive a control signal (e.g., a startup enabling signal, such as the startup enabling signal 428) at the control terminal 506. The switch circuit 500 may be configured to control an electrically conductive path between the supply terminal 502 and the output terminal 504 as a function of the control signal at the control terminal 506.

As an exemplary configuration, the switch circuit 500 may include a field-effect transistor 508 coupled between the supply terminal 502 and the output terminal 504. It is understood that the field-effect transistor 508 is an example of a controllable switchable element to control the electrically conductive path between the supply terminal 502 and the output terminal 504, and that other types of switchable elements may be provided (e.g., other types of transistors, and the like).

The field-effect transistor 508 may include a second control node 510s (e.g., a source node 510s), a third control node 510d (e.g., a drain node 510d), and a first control node 510g (e.g., a gate node 510g) configured to control an electrical behavior of the second control node 510s and the third control node 510d. Illustratively, a signal at the first control node 510g may control a resistance of a channel between the second control node 510s and the third control node 510d.

One of the second control node 510s or the third control node 510d (e.g., the source node 510s in the configuration in FIG. 5A) may be coupled with the supply terminal 502, and the other one of the second control node 510s or the third control node 510d (e.g., the drain node 510d in the configuration in FIG. 5A) may be coupled with the output terminal 504. The first control node 510g may be coupled with the control terminal 506.

A control signal (e.g., a voltage) at the first control node 510g may be provided to control the field-effect transistor 508, e.g. to allow or prevent a current flow (a drain current) in the channel between the second control node 510s and the third control node 510d. The first state of the switching circuit 500 may correspond to a first state of the field-effect transistor 508 in which a current flow between the second control node 510s and the third control node 510d is allowed, and the second state of the switching circuit 500 may correspond to a second state of the field-effect transistor 508 in which the current flow between the second control node 510s and the third control node 510d is prevented.

The switch circuit 500 may be configured to switch into the first state in response to an enabling signal (e.g., the enabling signal 420 of FIG. 4A) that is indicative of the enablement of the operation of a bandgap reference circuit. The enabling signal may be used (e.g., at a multiplexer 560) to provide a control signal (e.g., the startup enabling signal 428 of FIG. 4A) at the control terminal 506 (and at the first control node 510g of the field-effect transistor 508) to allow a current flow between the second node 504 and the 506 (illustratively, to establish an electrically conductive connection between the supply terminal 502 and the output terminal 504). The enabling signal may set the startup enabling signal to low, which may be provided as control signal at the control terminal 506 to bring the field-effect transistor 508 into the first state.

The switch circuit 500 may be configured to switch into the second state in response to the voltage value of the feedback voltage being (or becoming) equal to or greater than the target voltage value (illustratively, in response to an output signal of the comparator circuit indicating that the feedback voltage is equal to or greater than the target voltage value). Such output signal from the comparator circuit may provide a control signal at the control terminal 506 to prevent a current flow between the second node 510s and the third node 510d (illustratively, to disconnect the electrically conductive connection between the supply terminal 502 and the output terminal 504). Such output signal from the comparator circuit may set the startup enabling signal to high, which may be provided as control signal at the control terminal 506 to bring the field-effect transistor 508 into the second state.

In the exemplary configuration in FIG. 5A, the switch circuit 500 may include (or may be coupled with) a multiplexer 560. The multiplexer 560 may receive, as input signals, a first input signal 562 corresponding to the output signal of a watchdog circuit of the startup circuit, and a second input signal 564 corresponding to the output signal of a comparator circuit of the startup circuit. The multiplexer 560 may deliver the control signal (e.g., the startup enabling signal) to the control terminal 506 of the switch circuit 500 based on the first input signal 562 and second input signal 564.

As a further aspect, as shown in FIG. 5A, the switch circuit 500 may include or may be coupled with an indicator signal generator 570 configured to generate an indicator signal 576 indicative a stable operation of the bandgap reference circuit. As an exemplary configuration, the indicator signal generator 570 may include an AND logic gate 572 receiving as inputs an inverted version of the enable signal and the control signal delivered at the control terminal 506 of the switch circuit 500 (illustratively, the startup enabling signal). For example, the output of the AND logic gate 572 may become a logic "1" as soon as the startup enabling signal becomes low (e.g., as a result of the comparison, or as a result of an elapsed time), thus leading to the indicator signal generator 570 outputting the indicator signal 576. In the exemplary configuration in FIG. 5A, the indicator signal generator 570 may further include a delay stage 574 configured to impose a delay onto the providing of the indicator signal 576.

FIG. 5B shows a comparator circuit 520 for a startup circuit in a schematic view, according to various aspects. The comparator circuit 520 may be an exemplary configuration of the comparator circuit 412 described in relation to FIG. 4A. In the exemplary configuration in FIG. 5B, the comparator circuit 520 includes a comparator 535 to compare a feedback voltage 522 (e.g., the feedback voltage 406 of FIG. 4A, as voltage BG_V1 at an input terminal of an operational amplifier of a bandgap reference circuit) with a target voltage 524 (e.g., the target voltage 414 of FIG. 4A, SW_LEV). It is however understood that the configuration in FIG. 5B is exemplary, and other circuit configurations to compare a feedback voltage 522 (e.g., the feedback voltage 406 of FIG. 4A, as voltage BG_V1 at an input terminal of an operational amplifier of a bandgap reference circuit) with a target voltage 524 (e.g., the target voltage 414 of FIG. 4A, SW_LEV) may be provided.

The comparator circuit 520 may include a first input terminal 526, a second input terminal 528, and an output terminal 530 (also referred to herein as comparator terminal or comparison output terminal). The comparator circuit 520 may be configured to receive the feedback voltage 522 at one of the first input terminal 526 or the second input terminal 528 (e.g., at the first input terminal 526 in the configuration in FIG. 5B), and to receive the target voltage 524 at the other one of the first input terminal 526 or the second input terminal 528 (e.g., at the second input terminal 528 in the configuration in FIG. 5B). The comparator circuit 520 may be configured to compare the feedback voltage 522 and the target voltage 524 with one another, e.g. to determine which one of the feedback voltage 522 or the target voltage 524 has the greatest voltage value.

The comparator circuit 520 may be configured to provide at the output terminal 530 a first output voltage representative of a first logic value in the case that the voltage value of the feedback voltage 522 is equal to or greater than the voltage value of the target voltage 524, and to provide at the output terminal 530 a second output voltage representative of a second logic value in the case that the voltage value of the feedback voltage 522 is less than the voltage value of the target voltage 524. Only as an example, the first output voltage may have a high voltage value (e.g., 1 V, to represent a logic "1"), and the second output voltage may have a low voltage value (e.g., 0 V, to represent a logic "0"); illustratively, the first output voltage may have a voltage value greater than the second output voltage.

The comparator circuit 520 may be configured to provide the first output voltage or the second output voltage by connecting the output terminal 530 either with a supply terminal 532 (at which the comparator circuit 520 may receive a supply voltage, VDD) or with a reference terminal 534 (at which the comparator circuit 520 may receive a base voltage, e.g. ground voltage), respectively.

For example, the comparator 535 may be or include one or more inverter stages. For example, the comparator 535 may include a PMOS field-effect transistor and a NMOS field-effect transistor to control the connection of the output terminal 530 with either the supply terminal 532 or the reference terminal 534. The PMOS field-effect transistor may be coupled between the output terminal 530 and the supply terminal 532, and the NMOS field-effect transistor may be coupled between the output terminal 530 and the reference terminal 534.

Depending on the result of the comparison between the feedback voltage 522 and the target voltage 524, either the PMOS field-effect transistor or the NMOS field-effect transistor may be turned ON (and the other may be turned OFF). Illustratively, in the case that the voltage value of the feedback voltage 522 is equal to or greater than the target voltage value, the PMOS field-effect transistor may be turned ON and the NMOS field-effect transistor may be turned OFF, so that an electrically conductive path is established between the output terminal 530 and the supply terminal 532, and the voltage value at the output terminal 530 is pulled high. In the case that the voltage value of the feedback voltage 522 is less than the target voltage value, the PMOS field-effect transistor may be turned OFF and the NMOS field-effect transistor may be turned ON, so that an electrically conductive path is established between the output terminal 530 and the reference terminal 534, and the voltage value at the output terminal 530 is pulled low.

The voltage value of the output voltage of the comparator circuit 520 may control the behavior of the startup circuit. A startup circuit (e.g., the startup circuit 400) may be configured to maintain (and increase) the startup voltage (e.g., at the output terminal 404 of FIG. 4A) in response to the comparator circuit 520 providing the second output voltage at the output terminal 530. The startup circuit may be configured to stop providing the startup voltage (e.g., at the output terminal 404 of FIG. 4A) in response to the comparator circuit 520 providing the first output voltage at the output terminal 530. It is understood that the definition of the logic values and the corresponding behavior of a startup circuit may be arbitrary, and other configurations may be provided.

In various aspects, as shown in the exemplary configuration in FIG. 5B, an enabling signal 531 (e.g., corresponding to the enabling signal 420 of FIG. 4A) may enable an operation of the comparator circuit 520. For example, the enabling signal 531 may control a field-effect transistor 533 to enable the connection between the comparator circuit 520 (the reference terminal 534) and the reference voltage (e.g., ground).

FIG. 5C shows a trimmer circuit 540 for a startup circuit in a schematic view, according to various aspects. The trimmer circuit 540 may be an exemplary configuration of the trimmer circuit 416 described in relation to FIG. 4A. It is understood that other configurations of the trimmer circuit 540 may be provided to generate a target voltage having a desired (and adjustable) target voltage value.

The trimmer circuit 540 may include a supply terminal 542 and may be configured to receive a supply voltage, VDD, at the supply terminal 542. The trimmer circuit 540 may include a reference terminal 544, and may be configured to receive a reference voltage, VSS, at the reference terminal 544 (e.g., a ground voltage, e.g. the reference terminal 544 may be connected to ground). The trimmer circuit 540 may further include an output terminal 546, and may be configured to provide (as output) a target voltage (e.g., the target voltage 414 of FIG. 4A) as a combination of the supply voltage and the reference voltage.

The trimmer circuit 540 may include a first plurality of first switchable elements 548 coupled between the supply terminal 542 and the output terminal 546. As an exemplary configuration, the first plurality of first switchable elements 548 may include a plurality of PMOS field-effect transistors (e.g., a number n of PMOS field-effect transistors). The first switchable elements 548 may be configured to control a resistance of the electrically conductive path between the supply terminal 542 and the output terminal 546, e.g. to control a contribution of the supply voltage to the target voltage.

The trimmer circuit 540 may include a second plurality of second switchable elements 550 coupled between the reference terminal 544 and the output terminal 546. As an exemplary configuration, the second plurality of second switchable elements 550 may include a plurality of NMOS field-effect transistors (e.g., a number n of NMOS field-effect transistors). The second switchable elements 550 may be configured to control a resistance of the electrically conductive path between the reference terminal 544 and the output terminal 546, e.g. to control a contribution of the reference voltage to the target voltage.

The trimmer circuit 540 may be configured to control the first switchable elements 548 of the first plurality of first switchable elements 548 and the second switchable elements 550 of the second plurality of second switchable elements 550 to control the voltage value of the target voltage (provided) at the output terminal 546. The trimmer circuit 540 may be configured to control the voltage value of the target voltage by controlling the number of first and second switchable elements 548, 550 that are turned ON or OFF, to control a respective contribution of the supply voltage and the reference voltage to the target voltage. The first and second switchable elements 548, 550 may be illustratively understood as switchable bits that may be individually controlled to set the voltage value of the target voltage at the output terminal 546. For example, the trimmer circuit 540 may be configured to receive a control signal indicative of the number (e.g., which and how many) of first and second switchable elements 548, 550 to turn ON to set the voltage value of the voltage at the output terminal 546.

Figure 6A:
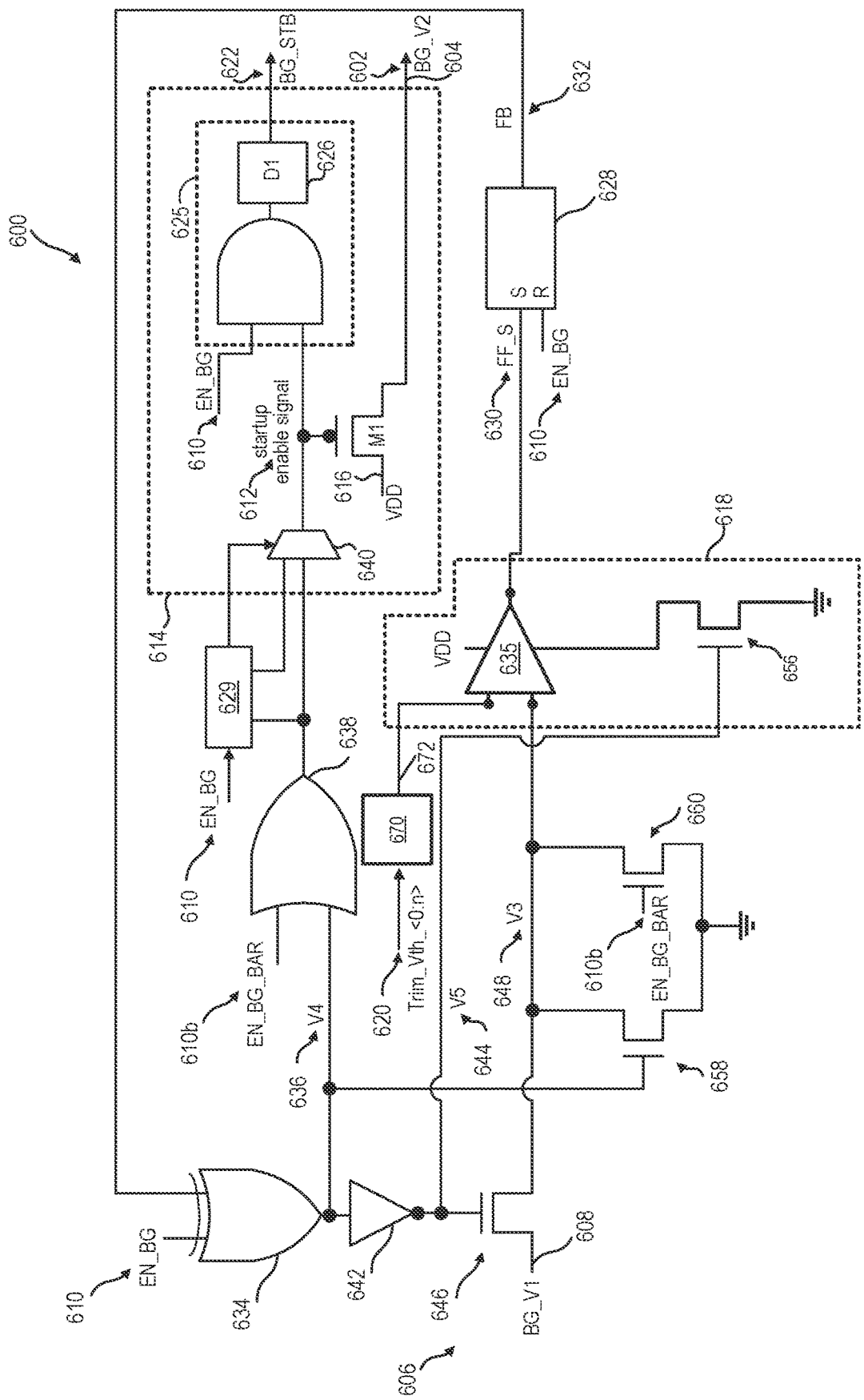
FIG. 6A shows an exemplary configuration of a startup circuit in a schematic view according to various aspects.
Figure 6B:
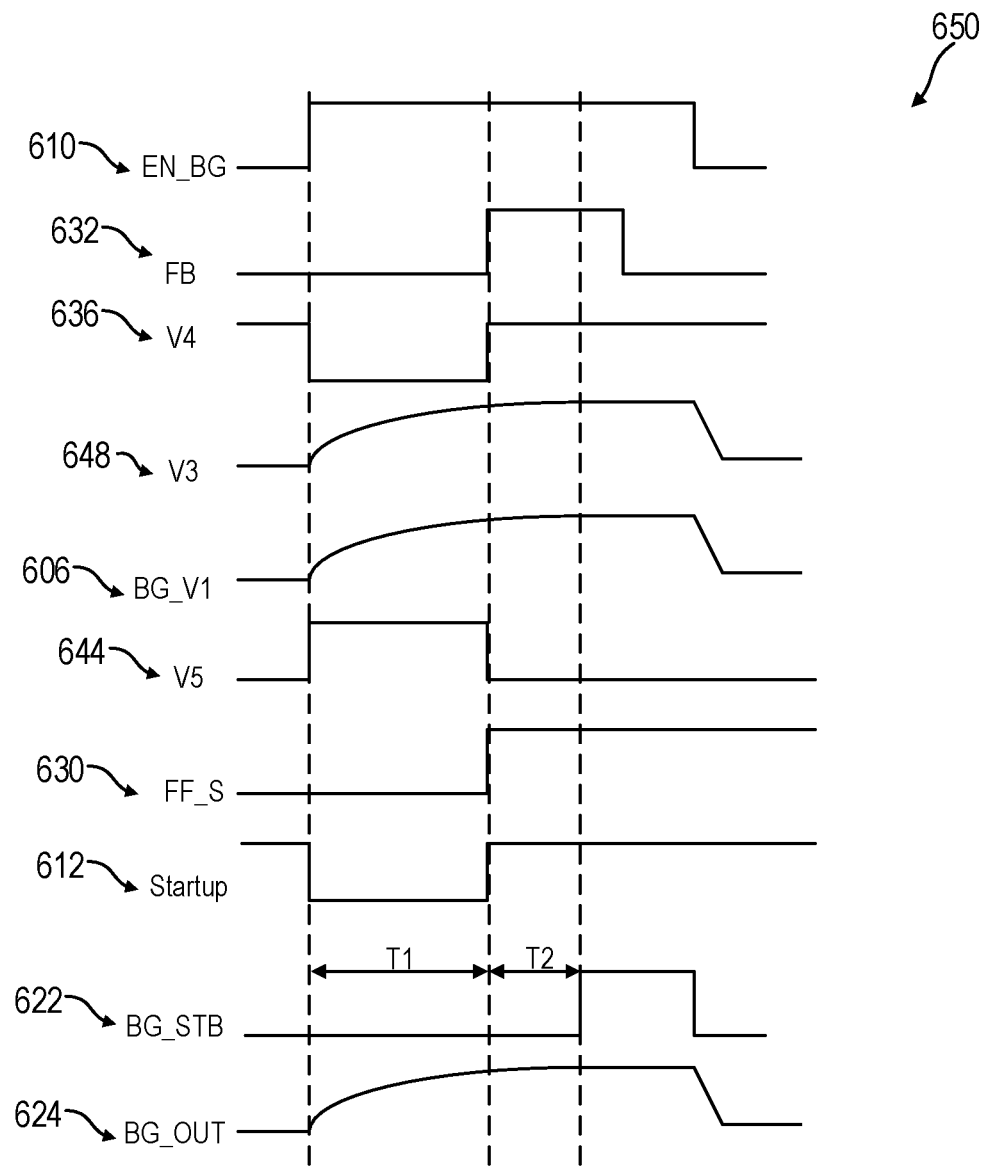
FIG. 6B shows schematically a time diagram associated with an operation of a startup circuit according to various aspects.

FIG. 6A shows a startup circuit 600 in a schematic view, according to various aspects. The startup circuit 600 may be an exemplary configuration of the startup circuit 200, 400 described in relation to FIG. 2 and FIG. 4A. FIG. 6B shows a schematic time diagram 650 illustrating an operation of the startup circuit 600, according to various aspects.

The startup circuit 600 may be configured to provide a startup voltage 602 at an output terminal 604 (e.g., as voltage, BG_V2, at the non-inverting terminal of an operational amplifier of the bandgap reference circuit), and may be configured to receive a feedback voltage 606 at an input terminal 608 (e.g., as voltage, BG_V1, at the inverting terminal of the operational amplifier of the bandgap reference circuit).

The startup circuit 600 may include a switch circuit 614, a comparator circuit 618, and a trimmer circuit 670, e.g. as described in relation to the switch circuit 410, 500, the comparator circuit 412, 520, and the trimmer circuit 416, 540, respectively. The startup circuit 600 may further include various logic circuits (e.g., logic gates) to control the interplay between the various components.

Enabling the bandgap (illustratively, setting high an enabling signal 610, EN BG, e.g. EN BG=1) may enable the operation of the bandgap reference circuit, and may set a startup enabling signal 612 low (e.g., at 0 V). The startup enabling signal 612 being low may control the switching circuit 614 to electrically conductively connect the output terminal 604 and a supply terminal 616. As an exemplary configuration, the switching circuit 614 may include a PMOS field-effect transistor, M1, that is turned ON by the startup enabling signal 612 being low. The PMOS field-effect transistor may be coupled between the supply terminal 616 (at which the startup circuit 600 may receive a supply voltage, VDD) and the output terminal 604, to control the voltage value of the startup voltage 602.

The startup enabling signal 612 being low may thus ramp the startup voltage 602 (illustratively, the voltage, BG_V2, at the non-inverting input of the operational amplifier), towards the supply voltage, VDD. The operational amplifier in the bandgap reference circuit may equalize the voltages at the non-inverting terminal and inverting terminal; illustratively, it may equalize BG_V1 and BG_V2. The voltage, BG_V1, at the inverting terminal may be probed by the startup circuit 600 (as feedback voltage 606). When the voltage, BG_V1, reaches a predefined level (also referred to herein as bandgap working level), the startup pulse may be stopped (illustratively, the startup enabling signal 612 may be turned high to turn OFF the PMOS field-effect transistor).

The startup circuit 600 may include a comparator circuit 618 configured to carry out, via comparator 635, the comparison between the feedback voltage 606 and a target voltage associated with the bandgap reference circuit. The trimmer circuit 670 may be configured to define the level of BG_V1 to stop the startup pulse, e.g. the trimmer circuit 670 may provide a target voltage 672 to the comparator circuit 618, and the target voltage 672 may be adjusted by proper sizing using trimmer bits 620. In an exemplary configuration, the comparator 635 may include a PMOS field-effect transistor coupled between a supply terminal and an output terminal, and a NMOS field-effect transistor coupled between the output terminal and a reference terminal. The comparator circuit 618 (e.g., the NMOS field-effect transistor) may be coupled to ground over a further field-effect transistor 656. The field-effect transistor 656 may be configured (e.g., controlled) to enable or disable the connection to ground (illustratively, to enable or disable the operation of the comparator circuit 618) as a function of the enabling signal 610 and of the result of the comparison at the comparator circuit 618.

The startup circuit 600 may further include two field-effect transistors 658, 660 along the path between the input terminal 608 and the comparator circuit 618.

The startup circuit 600 may further include a watchdog circuit 629 configured to stop the operation of the startup circuit 600 after a predefined time period (from the reception of the enabling signal 610). The watchdog 629 may be added to avoid any stuck condition of the startup circuit 600.

The startup circuit 600 may further include various electronic circuits configured to implement logic functionalities, to control the operation of the startup circuit 600, as described in further detail below. It is understood that the logic circuits described herein are exemplary, and other logic circuits may be provided (e.g., combined with one another) to provide a same functionality.

The startup circuit 600 may include a flip-flop 628 (a SR-flip-flop) configured to receive the output 630 (FF_S) of the comparator circuit 618 at one input (e.g., the "S" input), and to receive the enabling signal 610 at another input (e.g., the "R" input). The flip-flop 628 may be configured such that an output 632 (FB) of the flip-flop 628 flips to a high state in response to the output 630 of the comparator circuit 618 turning high (when the feedback voltage is equal to or greater than the target voltage).

The output 632 of the flip-flop 628 may be combined with the enabling signal 610 in a XNOR gate 634. The output voltage 636 (V4) of the XNOR gate 634 may be used as a control signal to control the provision of the startup voltage 602 at the output terminal 604, and to control (e.g., to enable or disable) the comparison of the feedback voltage 606 with the target voltage. The output voltage 636 of the XNOR gate 634 may be at a high level in the case that the output 632 of the flip-flop 628 flips to the high state.

In relation to the provision of the startup voltage 602 at the output terminal 604, the output voltage 636 of the XNOR gate 634 may be combined in an OR gate 638 with the inverse 610b (EN BG BAR) of the enabling signal 610. The output of the OR gate 638 may be combined in a multiplexer 640 with an output of the watchdog circuit 629, to provide the startup enabling signal 612 as output of the multiplexer 640. Illustratively, the output of the multiplexer may be high as soon as the output of the OR gate 638 or the output of the watchdog circuit 629 indicate that the startup circuit 600 should stop providing the startup voltage 602 at the output terminal 604.

In relation to the comparison of the feedback voltage 606 with the target voltage, the output 636 of the XNOR gate 634 may be provided at an inverter 642. The inverter output 644 (V5) may control a field-effect transistor 646 to connect or disconnect the input terminal 608 and the comparator circuit 618. Turning on the field-effect transistor 646 may enable providing the feedback voltage 606, e.g. as comparison voltage 648 (V3) at the comparator circuit 618.

The startup circuit 600 may be further configured to generate an indicator signal 622 (BG_STB) indicative that the bandgap reference circuit is in working mode (e.g., indicative that the bandgap reference circuit is in the stable on-mode). Illustratively, the indicator signal 622 may be representative of the output voltage 624 (BG_OUT) of the bandgap reference circuit being at the predefined output value. This indicator signal may be used in other circuits which are dependent on bandgap. As an example, the indicator signal 622 may be used to take output stable bandgap current as an input to the bandgap in order to ensure robust functionality. The startup circuit 600 may include an indicator signal generator 625 with a delay stage 626 (D1) configured to impose a delay onto the providing of the indicator signal 622.

As shown in the time diagram 650, during a first time period T1, BG_V1 is charged up, and after a second time period T2, the bandgap may become stable (may be in the desired stable on-state, e.g. the output voltage 624 of the bandgap reference circuit may be at the desired output value). After the period T2, the indicator signal 622 may be generated (or set high) to indicate the bandgap stable condition.

FIG. 7A shows a schematic flow diagram of a method 700a of operating a startup circuit (e.g., the startup circuit 200, 400, 600), according to various aspects. The method 700a is described in relation to a startup circuit proving a startup voltage and receiving a feedback voltage. It is however understood that the aspects described herein may apply in a corresponding manner to a startup circuit providing a startup current and receiving a feedback current.

The method 700a may include, in 702 providing a startup voltage (e.g., at an output terminal of the startup circuit, e.g. at a bandgap reference circuit). As an example, providing a startup voltage may include allowing a current flow in an electrically conductive path between a supply terminal and an output terminal of the startup circuit (e.g., between a supply source and the output terminal).

The method 700a may include, in 704, receiving a feedback voltage (e.g., at an input terminal of the startup circuit). In some aspects, the feedback voltage may be indicative of a startup condition of the bandgap reference circuit.

The method 700a may include, in 706, comparing a voltage value of the feedback voltage with a target voltage value. In some aspects, the target voltage value may be associated with the bandgap reference circuit. The target voltage value may be indicative of a startup condition of the bandgap reference circuit that triggers a stable on-state of the bandgap reference circuit.

In the case that the voltage value of the feedback voltage is equal to or greater than the target voltage value (yes in 706), the method 700a may include, in 708, stop providing the startup voltage. Stop providing the startup voltage may include, for example, preventing the current flow in the electrically conductive path between the supply terminal and the output terminal of the startup circuit (e.g., between the supply source and the output terminal). Illustratively, the method 700a may include stop providing the startup voltage in the case that the feedback voltage indicates a condition of the bandgap reference circuit from which the bandgap reference circuit will evolve into a desired stable operating state.

In the case that the voltage value of the feedback voltage is less than the target voltage value (no in 706), the method 700a may include, in 710, increasing the startup voltage (at the output terminal). Increasing the startup voltage may include, for example, maintaining the current flow between the supply terminal and the output terminal of the startup circuit (e.g., maintaining connected the output terminal and the supply terminal to allow a buildup of the voltage at the output terminal).

Figure 7B:
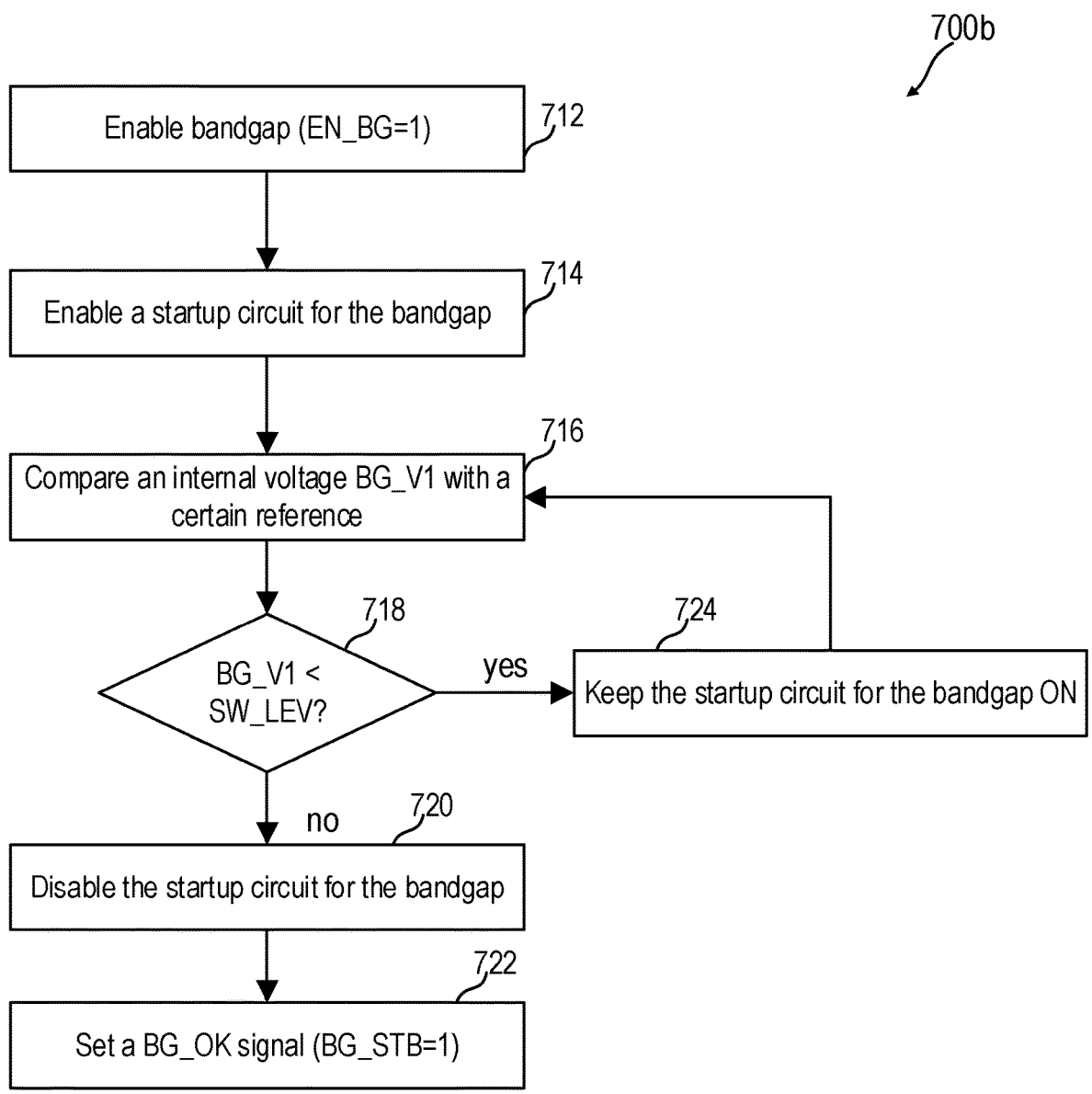

FIG. 7B shows a schematic flow diagram of a method 700b of operating a startup circuit (e.g., the startup circuit 200, 400, 600), according to various aspects. The method 700b is described in relation to a startup circuit proving a startup voltage and receiving a feedback voltage. It is however understood that the aspects described herein may apply in a corresponding manner to a startup circuit providing a startup current and receiving a feedback current. The method 700b may be understood as a method of starting up a bandgap reference circuit.

The method 700b may include, in 712, enabling the bandgap reference circuit, e.g. to prompt the bandgap reference circuit to begin its operation. Enabling the bandgap reference circuit may include, for example, setting an enabling signal to a high value (e.g., to 1). Enabling the bandgap reference circuit may be understood as starting a process that will lead to providing a bandgap reference voltage as output of the bandgap reference circuit.

The method 700b may include, in 714, enabling a startup circuit for the bandgap reference circuit. Enabling the startup circuit may include, for example, setting a startup enabling signal to a proper value, e.g. a low value. Setting the startup enabling signal low may provide allowing a current flow between the supply terminal and the output terminal of the startup circuit. Enabling the startup circuit may include start providing a startup voltage at the bandgap reference circuit.

The method 700b may include, in 716, comparing an internal voltage, BG_V1, with a certain reference. The internal voltage, BG_V1, may include a voltage in a branch of the bandgap reference circuit, e.g. may include a voltage at an input terminal of an operational amplifier of the bandgap reference circuit. In some aspects, the internal voltage, BG_V1, may be provided as a feedback voltage at the startup circuit. The reference, SW_LEV, may be understood as a target voltage value associated with the bandgap reference circuit.

The method 700b may include, in 718, determining whether a voltage value of the internal voltage, BG_V1, is less than the voltage value of the reference, SW_LEV. In the case that the voltage value of the internal voltage, BG_V1, is equal to or greater than the voltage value of the reference, SW_LEV, (no in 718), the method 700b may proceed to 720, otherwise (yes in 718) the method 700b may proceed to 724.

The method 700b may include, in 720, disabling the startup circuit for the bandgap reference circuit. Disabling the startup circuit may include, for example, setting the startup enabling signal to a proper value, e.g. a high value. Setting the startup enabling signal high may provide preventing a current flow between the supply terminal and the output terminal of the startup circuit. Disabling the startup circuit may include stop providing a startup voltage at the bandgap reference circuit.

The method 700b may include, in 722, providing an indicator signal (a BG OK signal), indicative of a stable operation of the bandgap reference circuit. Providing the indicator signal may include, for example, setting the indicator signal to a proper value, e.g. a high value (BG_STB=1).

In the case that the voltage value of the internal voltage, BG_V1, is less than the voltage value of the reference, SW_LEV, the method 700b may include, in 724, keeping the startup circuit for the bandgap reference circuit ON. Illustratively, the method 700b may include keeping the startup voltage at the bandgap reference circuit (e.g., maintaining the current flow between the supply terminal and the output terminal of the startup circuit).

The smart startup circuit and the smart startup methods described herein provide that a startup duration is automatically self-tuned according to PVT conditions (Process, Voltage, Temperature conditions), which makes the circuits faster and avoids unnecessary power consumption during the startup phase (e.g., the startup phase of a of chip served by the bandgap circuit). The smart startup circuit described herein may be trimmable to avoid any stuck. The extra watchdog feature may be added to avoid any further stuck not detected by the trimmer.

In the following, various examples are provided that may include one or more aspects described above with reference to a startup circuit (e.g., the startup circuit 200, 400, 600), a bandgap reference circuit (e.g., the bandgap reference circuit 100), a system including a startup circuit and a bandgap reference circuit (e.g., the system 300), and a method (e.g., the method 700a, 700b). It may be intended that aspects described in relation to the startup circuit, bandgap reference circuit, and/or system may apply also to the method(s), and vice versa.

Example 1 is a startup circuit for a bandgap reference circuit, wherein a target voltage value is associated with the bandgap reference circuit, the target voltage value being indicative of a startup condition of the bandgap reference circuit that triggers a stable on-state of the bandgap reference circuit, wherein the startup circuit is configured to: provide a startup voltage at the bandgap reference circuit to trigger a start of an operation of the bandgap reference circuit; receive a feedback voltage, wherein the feedback voltage is representative of a startup condition of the bandgap reference circuit; and either increase the startup voltage at the bandgap reference circuit in the case that a voltage value of the feedback voltage is less than the target voltage value, or stop providing the startup voltage at the bandgap reference circuit in the case that the voltage value of the feedback voltage is equal to or greater than the target voltage value.

For example, the stable on-state of the bandgap reference circuit may be associated with a predefined output voltage of the bandgap reference circuit.

In Example 2, the startup circuit of example 1 may optionally further include that the feedback voltage is representative of an evolution of the bandgap reference circuit from a stable off-state of the bandgap reference circuit towards the stable on-state.

In Example 3, the startup circuit of example 1 or 2 may optionally further include that the target voltage value is greater than 0 V and less than an output voltage provided by the bandgap reference circuit in the stable on-state.

In Example 4, the startup circuit of any one of examples 1 to 3 may optionally further include that the startup circuit is further configured to: receive an enabling signal indicative of an enablement of an operation of the bandgap reference circuit, and start providing the operating voltage at the bandgap reference circuit in response to the enabling signal.

In Example 5, the startup circuit of any one of examples 1 to 3 may optionally further include a supply terminal, and that the startup circuit is further configured to: receive a supply voltage at the supply terminal, and control an electrical behavior of an electrically conductive path between the supply terminal and the bandgap reference circuit as a function of the voltage value of the feedback voltage.

In Example 6, the startup circuit of example 5 may optionally further include a switch circuit coupled between the supply terminal and the bandgap reference circuit, wherein the switch circuit is configured, in a first state, to connect the electrically conductive path between the supply terminal and the bandgap reference circuit, and, in a second state, to disconnect the electrically conductive path between the supply terminal and the bandgap reference circuit, wherein the startup circuit is configured such that the switch circuit switches into the first state in response to the enabling signal indicative of the enablement of the operation of the bandgap reference circuit, and wherein the startup circuit is configured such that the switch circuit switches into the second state in the case that the voltage value of the feedback voltage is equal to or greater than the target voltage value.

In Example 7, the startup circuit of any one of examples 1 to 6 may optionally further include a trimmer circuit configured to generate a target voltage having the target voltage value.

In Example 8, the startup circuit of example 7 may optionally further include that the trimmer circuit includes a supply terminal, a reference terminal, and an output terminal; a first plurality of first switchable elements coupled between the supply terminal and the output terminal; and a second plurality of second switchable elements coupled between the reference terminal and the output terminal, wherein the trimmer circuit is configured to receive a supply voltage at the supply terminal and a reference voltage at the reference terminal, and wherein the trimmer circuit is configured to control the first switchable elements of the first plurality of first switchable elements and the second switchable elements of the second plurality of second switchable elements to control a voltage value of the target voltage at the output terminal.

In Example 9, the startup circuit of any one of examples 1 to 8 may optionally further include a comparator circuit, wherein the comparator circuit includes: a first input terminal, a second input terminal, and an output terminal; wherein the comparator circuit is configured to: receive the feedback voltage at the first input terminal and a target voltage at the second input terminal, and provide at the output terminal a first output voltage representative of a first logic value in the case that the voltage value of the feedback voltage is equal to or greater than the target voltage value, and provide at the output terminal a second output voltage representative of a second logic value in the case that the voltage value of the feedback voltage is less than the target voltage value.

In Example 10, the startup circuit of example 9 may optionally further include that the first output voltage has a high voltage value and the second output voltage has a low voltage value.

In Example 11, the startup circuit of example 9 or 10 may optionally further include that the startup circuit is configured to stop providing the startup voltage at the bandgap reference circuit in response to the comparator circuit providing the first output voltage.

In Example 12, the startup circuit of any one of examples 1 to 11 may optionally further include that the startup circuit is further configured to provide an indicator signal indicative of the bandgap reference circuit being in the stable on-state in response to the voltage value of the feedback voltage being equal to or greater than the target voltage value.

In Example 13, the startup circuit of example 12 may optionally further include a delay stage configured to impose a delay on providing the indicator signal.

In Example 14, the startup circuit of any one of examples 1 to 13 may optionally further include a watchdog circuit configured to: receive the enabling signal indicative of the enablement of the operation of the bandgap reference circuit, and stop an operation of the startup circuit after a predefined period of time has elapsed from the reception of the enabling signal at the watchdog circuit.

Example 15 is a system including: a bandgap reference circuit; and the startup circuit according to any one of examples 1 to 14, wherein the startup circuit is configured to provide the startup voltage at the bandgap reference circuit.

In Example 16, the system of example 15 may optionally further include that the bandgap reference circuit includes an operational amplifier, the operational amplifier including an inverting terminal and a non-inverting terminal, wherein one of the inverting terminal or the non-inverting terminal of the operational amplifier is configured to receive the startup voltage provided by the startup circuit, and wherein the startup circuit is configured to receive a voltage at the other one of the inverting terminal or the non-inverting terminal of the operational amplifier as feedback voltage.

In Example 17, the system of example 16 may optionally further include that the bandgap reference circuit is configured such that, upon the startup voltage being provided by the startup circuit at one of the inverting terminal or the non-inverting terminal of the operational amplifier, the voltage at the other one of the inverting terminal or the non-inverting terminal of the operational amplifier increases in accordance with the startup voltage.

In Example 18, the system of example 16 or 17 may optionally further include that the bandgap reference circuit is configured such that, in the case that a voltage value of a voltage at the inverting terminal or the non-inverting terminal of the operational amplifier is equal to or greater than the target voltage value, the bandgap reference circuit evolves towards the stable on-state.

Example 19 is a startup circuit for a bandgap reference circuit, the startup circuit including: a comparator circuit, wherein the comparator circuit comprises a first input terminal, a second input terminal, and an output terminal, and wherein the comparator circuit is configured to: receive a feedback voltage at the first input terminal and a target voltage at the second input terminal, and provide at the output terminal a first output voltage representative of a first logic value in the case that a voltage value of the feedback voltage is equal to or greater than a voltage value of the target voltage, and provide at the output terminal a second output voltage representative of a second logic value in the case that the voltage value of the feedback voltage is less than the voltage value of the target voltage; wherein the startup circuit is configured to: either increase the startup voltage in response to the comparator circuit providing the second output voltage at the output terminal, or stop providing the startup voltage in response to the comparator circuit providing the first output voltage at the output terminal, wherein the voltage value of the feedback voltage being equal to or greater than the voltage value of the target voltage is indicative of a startup condition of the bandgap reference circuit that triggers a stable on-state of the bandgap reference circuit.

In Example 20, the startup circuit of example 19 may include one or more features of any one of examples 1 to 14.

Example 21 is a startup circuit including an output terminal and an input terminal, wherein the startup circuit is configured to: provide a startup voltage at the output terminal; receive a feedback voltage at the input terminal; and either increase the startup voltage at the output terminal in the case that a voltage value of the feedback voltage is less than a target voltage value, or stop providing the startup voltage at the output terminal in the case that the voltage value of the feedback voltage is equal to or greater than the target voltage value.

In Example 22, the startup circuit of example 21 may include one or more features of any one of examples 1 to 14.

Example 23 is a method of starting up a bandgap reference circuit, wherein a target voltage value is associated with the bandgap reference circuit, the target voltage value being indicative of a startup condition of the bandgap reference circuit that triggers a stable on-state of the bandgap reference circuit, the method including: providing a startup voltage at the bandgap reference circuit to trigger a start of an operation of the bandgap reference circuit; receiving a feedback voltage representative of a startup condition of the bandgap reference circuit; comparing a voltage value of the feedback voltage with the target voltage value; and either increasing the startup voltage at the bandgap reference circuit in the case that the voltage value of the feedback voltage is less than the target voltage value, or stop providing the startup voltage at the bandgap reference circuit in the case that the voltage value of the feedback voltage is equal to or greater than the target voltage value.

In Example 24, the method of example 23 may optionally further include that the target voltage value is greater than 0 V and less than a bandgap voltage provided by the bandgap reference circuit.

Example 25 is a method of operating a startup circuit, the method including: providing a startup signal (e.g., at an output terminal of the startup circuit); receiving a feedback signal indicative of a startup condition of a bandgap reference circuit; and stop providing the startup signal in the case that the feedback signal indicates a startup condition of the bandgap reference circuit that triggers a stable on-state of the bandgap reference circuit.

In Example 26, the method of example 25 may optionally further include that providing the startup voltage includes allowing a current flow in an electrically conductive path between a supply terminal and an output terminal of the startup circuit.

In Example 27, the method of example 25 or 26 may optionally further include that a target voltage value is associated with the bandgap reference circuit, the target voltage value being indicative of the startup condition of the bandgap reference circuit that triggers the stable on-state of the bandgap reference circuit, wherein method further includes comparing a voltage value of the feedback voltage with the target voltage value.

In Example 28, the method of any one of examples 25 to 27 may optionally further include that stop providing the startup voltage includes preventing the current flow in the electrically conductive path between the supply terminal and the output terminal of the startup circuit.

Example 29 is a startup circuit for a bandgap reference circuit, wherein a target voltage value is associated with the bandgap reference circuit, the target voltage value being indicative of an evolution of the bandgap reference circuit towards a (desired) stable operating state of the bandgap reference circuit, wherein the startup circuit is configured to: provide a startup voltage at the bandgap reference circuit to start an operation of the bandgap reference circuit; receive a feedback voltage, wherein the feedback voltage is representative of a condition of the bandgap reference circuit; and either increase the startup voltage at the bandgap reference circuit in the case that a voltage value of the feedback voltage is less than the target voltage value, or stop providing the startup voltage at the bandgap reference circuit in the case that the voltage value of the feedback voltage is equal to or greater than the target voltage value.

In Example 30, the startup circuit of example 29 may include one or more features of any one of examples 1 to 14.

The terms "at least one" and "one or more" may be understood to include any integer number greater than or equal to one, i.e. one, two, three, four, [ . . . ], etc. The term "a plurality" or "a multiplicity" may be understood to include any integer number greater than or equal to two, i.e. two, three, four, five, [ . . . ], etc. The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g. provided by a metal or degenerate semiconductor in absence of p-n junctions in the current path. The term "electrically conductively connected" may be also referred to as "galvanically connected".

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A startup circuit for providing a startup voltage to a bandgap reference circuit that provides a predefined bandgap reference voltage, the startup circuit comprising:
   a comparator circuit comprising a feedback terminal, a target voltage terminal, and a comparison output terminal, wherein the comparator circuit is configured to provide a comparison voltage at the comparison output terminal that indicates a feedback voltage value received from the bandgap reference circuit at the feedback terminal compared with a target voltage value received at the target voltage terminal,
   wherein the target voltage value represents a startup condition of the bandgap reference circuit that provides a stable on-state of the bandgap reference circuit, wherein the target voltage value is less than the predefined bandgap reference voltage; and
   a trimmer circuit configured to generate a target voltage having the target voltage value and provide the target voltage to the target voltage terminal of the comparator circuit;
   a switch circuit connected between the comparator circuit and the bandgap reference circuit, the switch circuit comprising:
     a switching input terminal connected to the comparison output terminal; and
     a bandgap voltage output terminal connected to the bandgap reference circuit, wherein the switch circuit is configured to selectively provide the startup voltage at the bandgap voltage output terminal based on a comparison voltage value of the comparison voltage, wherein the switch circuit is configured to:
       increase a value of the startup voltage in the case that the comparison voltage value indicates the feedback voltage value is less than the target voltage value; and
       stop providing the startup voltage in the case that the comparison voltage value indicates the feedback voltage value is equal to or greater than the target voltage value.

2. The startup circuit according to claim 1,
   wherein the stable on-state of the bandgap reference circuit is associated with a predefined output voltage of the bandgap reference circuit.

3. The startup circuit according to claim 1,
   wherein the feedback voltage value represents an evolution of the bandgap reference circuit from a stable off-state of the bandgap reference circuit towards the stable on-state.

4. The startup circuit according to claim 1,
   wherein the target voltage value is greater than 0 V and less than the predefined bandgap reference voltage.

5. The startup circuit according to claim 1, further comprising a supply terminal configured to:
receive a supply voltage, wherein the switch circuit is configured to control an electrical behavior of an electrically conductive path between the supply terminal and the bandgap voltage output terminal as a function of the feedback voltage value.

6. The startup circuit according to claim 5,
wherein the switch circuit is configured, in a first state, to connect the electrically conductive path between the supply terminal and the bandgap voltage output terminal, and, in a second state, to disconnect the electrically conductive path between the supply terminal and the bandgap voltage output terminal,
wherein the switch circuit is configured to switch into the first state in response to an enabling signal indicative of an enablement of the operation of the bandgap reference circuit, and
wherein the switch circuit is further configured to switch into the second state in the case that the comparison voltage value indicates the feedback voltage value is equal to or greater than the target voltage value.

7. The startup circuit according to claim 1, wherein the trimmer circuit comprises:
a supply terminal;
a reference terminal; and
a trimmer output terminal;
a first plurality of first switchable elements coupled between the supply terminal and the trimmer output terminal; and
a second plurality of second switchable elements coupled between the reference terminal and the trimmer output terminal,
wherein the trimmer circuit is configured to:
receive a supply voltage at the supply terminal and a reference voltage at the reference terminal; and
control the first switchable elements of the first plurality of first switchable elements and the second switchable elements of the second plurality of second switchable elements to adjust the target voltage value provided at the trimmer output terminal.

8. The startup circuit according to claim 1, wherein the comparison voltage comprises a first voltage value representative of a first logic value in the case that the feedback voltage value is equal to or greater than the target voltage value and a second voltage value representative of a second logic value in the case that the feedback voltage value is less than the target voltage value.

9. The startup circuit according to claim 8, wherein the switch circuit is configured to:
stop providing the startup voltage in the case that the comparison voltage value is the first voltage value.

10. The startup circuit according to claim 1, the startup circuit further comprising an indicator output terminal, and wherein the startup circuit further comprises an indicator signal generator configured to generate an indicator signal indicative of whether the bandgap reference circuit is in the stable on-state and to provide the generated indicator signal at the indicator output terminal, wherein the indicator signal generator is configured to provide the indicator signal at the indicator output terminal if the comparison voltage indicates the feedback voltage value is equal to or greater than the target voltage value.

11. The startup circuit according to claim 1, further comprising a watchdog circuit connected to the switch circuit, the watchdog circuit configured to:
receive an enabling signal indicative of an enablement of the operation of the bandgap reference circuit at an enabling time; and
cause the switch circuit to stop providing the startup voltage after a predefined period of time elapsed since the enabling time.

12. The startup circuit according to claim 1,
wherein the bandgap reference circuit comprises an operational amplifier, the operational amplifier comprising an inverting terminal and a non-inverting terminal,
wherein one of the inverting terminal or the non-inverting terminal of the operational amplifier is configured to receive the startup voltage provided by the startup circuit, and
wherein the other one of the inverting terminal and the non-inverting terminal of the operational amplifier is connected to the feedback terminal of the comparator circuit and provides the feedback voltage value.

13. The startup circuit according to claim 12,
wherein the bandgap reference circuit is configured to evolve toward the stable on-state based on whether a voltage value at the inverting terminal or the non-inverting terminal is equal to or greater than the target voltage value.

14. A startup circuit for providing a startup voltage to a bandgap reference circuit that provides a predefined bandgap reference voltage, the startup circuit comprising:
a comparator circuit comprising a feedback terminal, a target voltage terminal, and a comparison output terminal, wherein the comparator circuit is configured to provide a comparison voltage at the comparison output terminal that indicates a feedback voltage value received from the bandgap reference circuit at the feedback terminal compared with a target voltage value received at the target voltage terminal,
wherein the target voltage value represents a startup condition of the bandgap reference circuit that provides a stable on-state of the bandgap reference circuit, wherein the target voltage value is less than the predefined bandgap reference voltage; and
a switch circuit connected between the comparator circuit and the bandgap reference circuit, the switch circuit comprising:
a switching input terminal connected to the comparison output terminal; and
a bandgap voltage output terminal connected to the bandgap reference circuit, wherein the switch circuit is configured to selectively provide the startup voltage at the bandgap voltage output terminal based on a comparison voltage value of the comparison voltage, wherein the switch circuit is configured to:
increase a value of the startup voltage in the case that the comparison voltage value indicates the feedback voltage value is less than the target voltage value; and
stop providing the startup voltage in the case that the comparison voltage value indicates the feedback voltage value is equal to or greater than the target voltage value; and
a supply terminal configured to receive a supply voltage, wherein the switch circuit is configured to control an electrical behavior of an electrically conductive path between the supply terminal and the bandgap voltage output terminal as a function of the feedback voltage value, wherein the switch circuit is configured, in a first state, to connect the electrically conductive path between the supply terminal and the bandgap voltage output terminal, and, in a second state, to disconnect the electrically conductive path between the supply terminal and the bandgap voltage output terminal, wherein the switch circuit is configured to switch into the first state in response to an enabling signal indicative of an enablement of the operation of the bandgap reference circuit, and wherein the switch circuit is further configured to switch into the second state in the case that the comparison voltage value indicates the feedback voltage value is equal to or greater than the target voltage value.

15. A startup circuit for providing a startup voltage to a bandgap reference circuit that provides a predefined bandgap reference voltage, the startup circuit comprising:

a comparator circuit comprising a feedback terminal, a target voltage terminal, and a comparison output terminal, wherein the comparator circuit is configured to provide a comparison voltage at the comparison output terminal that indicates a feedback voltage value received from the bandgap reference circuit at the feedback terminal compared with a target voltage value received at the target voltage terminal, wherein the target voltage value represents a startup condition of the bandgap reference circuit that provides a stable on-state of the bandgap reference circuit, wherein the target voltage value is less than the predefined bandgap reference voltage; and a switch circuit connected between the comparator circuit and the bandgap reference circuit, the switch circuit comprising:
  a switching input terminal connected to the comparison output terminal; and
  a bandgap voltage output terminal connected to the bandgap reference circuit, wherein the switch circuit is configured to selectively provide the startup voltage at the bandgap voltage output terminal based on a comparison voltage value of the comparison voltage, wherein the switch circuit is configured to:
    increase a value of the startup voltage in the case that the comparison voltage value indicates the feedback voltage value is less than the target voltage value; and
    stop providing the startup voltage in the case that the comparison voltage value indicates the feedback voltage value is equal to or greater than the target voltage value; and a watchdog circuit connected to the switch circuit, the watchdog circuit configured to:
  receive an enabling signal indicative of an enablement of the operation of the bandgap reference circuit at an enabling time; and
  cause the switch circuit to stop providing the startup voltage after a predefined period of time elapsed since the enabling time.

* * * * *